(12) United States Patent
Bang et al.

(10) Patent No.: US 11,476,442 B2
(45) Date of Patent: Oct. 18, 2022

(54) DISPLAY APPARATUS

(71) Applicant: Samsung Display Co., Ltd., Yongin-si (KR)

(72) Inventors: Kiho Bang, Yongin-si (KR); Eunhye Kim, Yongin-si (KR); Youngwoo Park, Yongin-si (KR); Saebom Ahn, Yongin-si (KR); Sanghyun Jun, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 56 days.

(21) Appl. No.: 16/817,087

(22) Filed: Mar. 12, 2020

(65) Prior Publication Data

US 2020/0381653 A1    Dec. 3, 2020

(30) Foreign Application Priority Data

May 28, 2019    (KR) .......................... 10-2019-0062586

(51) Int. Cl.
*H01L 51/52*    (2006.01)
*H01L 27/32*    (2006.01)

(52) U.S. Cl.
CPC ...... *H01L 51/5246* (2013.01); *H01L 27/3246* (2013.01); *H01L 51/5253* (2013.01)

(58) Field of Classification Search
CPC ............. H01L 51/5246; H01L 51/5253; H01L 27/3276; H01L 27/3246; H01L 27/3258; H01L 27/3279
See application file for complete search history.

(56) References Cited

U.S. PATENT DOCUMENTS

| | | | |
|---|---|---|---|
| 9,893,139 B2 | 2/2018 | Kim et al. | |
| 9,905,630 B2 | 2/2018 | Lee et al. | |
| 9,972,693 B2 | 5/2018 | Kim et al. | |
| 2016/0365398 A1* | 12/2016 | Kim | .................... H01L 27/3258 |
| 2017/0033312 A1* | 2/2017 | Kim | .................... H01L 51/5253 |
| 2017/0331058 A1* | 11/2017 | Seo | ........................... G09F 9/30 |

(Continued)

FOREIGN PATENT DOCUMENTS

| | | |
|---|---|---|
| KR | 10-2016-0147195 | 12/2016 |
| KR | 10-2017-0114027 | 10/2017 |

(Continued)

*Primary Examiner* — Vongsavanh Sengdara
(74) *Attorney, Agent, or Firm* — Kile Park Reed & Houtteman PLLC

(57) ABSTRACT

A display apparatus includes a substrate, a display area disposed on the substrate and including pixels, a non-display area disposed outside the display area, a first power supply voltage line including a first conductive layer disposed in the non-display area and a second conductive layer disposed on the first conductive layer, a second power supply voltage line disposed in the non-display area and including a third conductive layer spaced apart from the first conductive layer and a fourth conductive layer disposed on the third conductive layer, a first dam portion surrounding the display area and overlapping the second power supply voltage line, a second dam portion disposed adjacent to the first dam portion, and a cladding layer covering a first end portion of the fourth conductive layer formed in a direction intersecting a direction in which the first and second dam portions extend.

25 Claims, 16 Drawing Sheets

(56) References Cited

U.S. PATENT DOCUMENTS

| 2017/0345847 A1* | 11/2017 | Kim | ................ H01L 27/3244 |
| 2017/0365814 A1* | 12/2017 | Kim | ................ H01L 27/3276 |
| 2017/0373128 A1* | 12/2017 | Lee | ................ H01L 27/3276 |

FOREIGN PATENT DOCUMENTS

| KR | 10-2018-0001717 | 1/2018 |
| KR | 10-2018-0003363 | 1/2018 |

* cited by examiner

DISPLAY APPARATUS

CROSS-REFERENCE TO RELATED APPLICATION

This application claims priority to and benefits of Korean Patent Application No. 10-2019-0062586 under 35 U.S.C. § 119, filed in the Korean Intellectual Property Office on May 28, 2019, the entire contents of which are incorporated herein by reference.

BACKGROUND

1. Technical Field

Embodiments of this disclosure relate to a display apparatus, and to a display apparatus that may reduce the area of a narrow dead space of the display apparatus and may prevent cracks from occurring due to poor step coverage of a wiring unit.

2. Description of Related Art

Display apparatuses are apparatuses for visually representing or displaying data. Display apparatuses are currently being used for various purposes and applied to various applications. Also, as the thickness and the weight of display apparatuses have decreased, the range of applications of display apparatuses has increased.

A display apparatus may include a substrate that may be divided into a display area and a non-display area outside the display area. The non-display area where non-display elements such as a pad unit, wirings, and a driving circuit unit may be located or disposed may be a dead space where an image is not displayed. There has recently been an increase in the demand to further reduce dead spaces of display apparatuses.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments of the disclosure may prevent an undercut from being formed in an upper conductive layer of a second power supply voltage line by applying a double-layer structure to the second power supply voltage line, instead of reducing a width of the second power supply voltage line due to a decrease in a dead space. However, the above problem is merely an example, and thus does not limit the scope of the disclosure.

Additional aspects will be set forth in part in the description which follows and, in part, will be apparent from the description, or may be learned by practice of the presented embodiments of the disclosure.

According to one or more embodiments, a display apparatus may include a substrate, a display area disposed on the substrate and including pixels, a non-display area disposed outside the display area, a first power supply voltage line including a first conductive layer disposed in the non-display area and a second conductive layer disposed on the first conductive layer, a second power supply voltage line disposed in the non-display area and including a third conductive layer spaced apart from the first conductive layer and a fourth conductive layer disposed on the third conductive layer, a first dam portion surrounding the display area and overlapping the second power supply voltage line, a second dam portion disposed adjacent to the first dam portion, and a cladding layer covering a first end portion of the fourth conductive layer formed in a direction intersecting a direction in which the first and second dam portions extend.

The display apparatus may further include a first planarization film disposed in the display area and the non-display area; a second planarization film disposed on the first planarization film; and a pixel-defining film disposed on the second planarization film. The first dam portion may include a first layer including a part of the second planarization film and a second layer including a part of the pixel-defining film, and the second dam portion may include a first layer including a part of the second planarization film and a second layer including a part of the pixel-defining film.

The cladding layer may include the same material as a material of the second planarization film.

The first planarization film may be disposed between the first conductive layer and the second conductive layer, wherein the first power supply voltage line is electrically connected to the first conductive layer and the second conductive layer through a first contact hole formed in the first planarization layer.

The first planarization film may be disposed between the third conductive layer and the fourth conductive layer, wherein the first power supply voltage line is electrically connected to the third conductive layer and the fourth conductive layer through a second contact hole formed in the first planarization layer.

The display apparatus may further include a third dam portion disposed between the display area and the first dam portion and including a first layer including a part of the second planarization film and a second layer including a part of the pixel-defining film.

Each of the plurality of pixels may include a first electrode, an emission layer disposed on the first electrode, and a second electrode disposed on the emission layer, wherein the second electrode is commonly disposed over the plurality of pixels, wherein the second electrode extends to the non-display area and covers a part of the third dam portion.

The pixel-defining film may be disposed on the second planarization film and covers an end portion of the first electrode, wherein the display apparatus further includes a spacer disposed on the pixel-defining film, wherein the second dam portion further includes a third layer including the same material as a material of the spacer and formed on the second layer including the part of the pixel-defining film.

A height of the second dam portion may be greater than a height of each of the first dam portion and the third dam portion.

The third dam portion, the first dam portion, and the second dam portion may overlap the second power supply voltage line.

The third dam portion may overlap the first power supply voltage line, and the first dam portion and the second dam portion may overlap the second power supply voltage line.

At least two third dam portions may be disposed in the third dam portion.

A width of the first power supply voltage line may be greater than a width of the second power supply voltage line.

The second planarization film may cover a third end portion of the fourth conductive layer formed in a direction parallel to the direction in which the first and second dam portions extend.

The first conductive layer may include the same material as a material of the third conductive layer, and the second conductive layer may include the same material as a material of the fourth conductive layer.

The fourth conductive layer may further include a second end portion facing the first end portion, and, outside the second dam portion, the cladding layer may cover a top surface and the first and second end portions of the fourth conductive layer outside the second dam portion. the cladding layer may cover the first end portion without covering at least a part of a top surface of the fourth conductive layer between the first dam portion and the second dam portion.

The cladding layer may cover the first end portion without covering at least a part of a top surface of the fourth conductive layer between the first dam portion and the second dam portion.

The fourth conductive layer may further include a second end portion facing the first end portion outside the second dam portion, and, outside the second dam portion, the cladding layer may cover the first dam portion and the second dam portion without covering at least a part of a top surface of the fourth conductive layer.

The display apparatus may further include, a plurality of spider wirings spaced apart from one another in a direction intersecting a direction in which the first and third conductive layers extend between the substrate and the first and third conductive layers.

At least two insulating layers may extend to the display area between the plurality of spider wirings and the first and third conductive layers.

The display apparatus may further include a thin-film encapsulation layer including a first inorganic encapsulation layer covering the display area, an organic encapsulation layer disposed on the first inorganic encapsulation layer, and a second inorganic encapsulation layer disposed on the organic encapsulation layer, wherein the thin-film encapsulation layer covers the third dam portion and the first dam portion.

The first inorganic encapsulation layer and the second inorganic encapsulation layer may contact each other outside the second dam portion.

According to one or more embodiments, a display apparatus includes: a display area including a plurality of pixels; a non-display area disposed outside the display area; a first power supply voltage line disposed outside the non-display area; a second power supply voltage line spaced apart from the first power supply voltage line; a first dam portion surrounding the display area and overlapping the second power supply voltage line; a second dam portion adjacent to the first dam portion; a third dam portion disposed between the display area and the first dam portion; and an insulating layer forming a part of the first dam portion and the second dam portion, wherein the insulating layer covers a first end portion of the second power supply voltage line formed in a direction intersecting a direction in which the first through third dam portions extend and a third end portion of the second power supply voltage line formed in a direction parallel to the direction in which the first through third dam portions extend.

The insulating layer may further cover a top surface of the second power supply voltage line between the first end portion and the third end portion.

BRIEF DESCRIPTION OF THE DRAWINGS

The above and other aspects, features, and advantages of embodiments of the disclosure will be more apparent from the following description taken in conjunction with the accompanying drawings, in which.

DETAILED DESCRIPTION OF THE EMBODIMENTS

Figure 1:
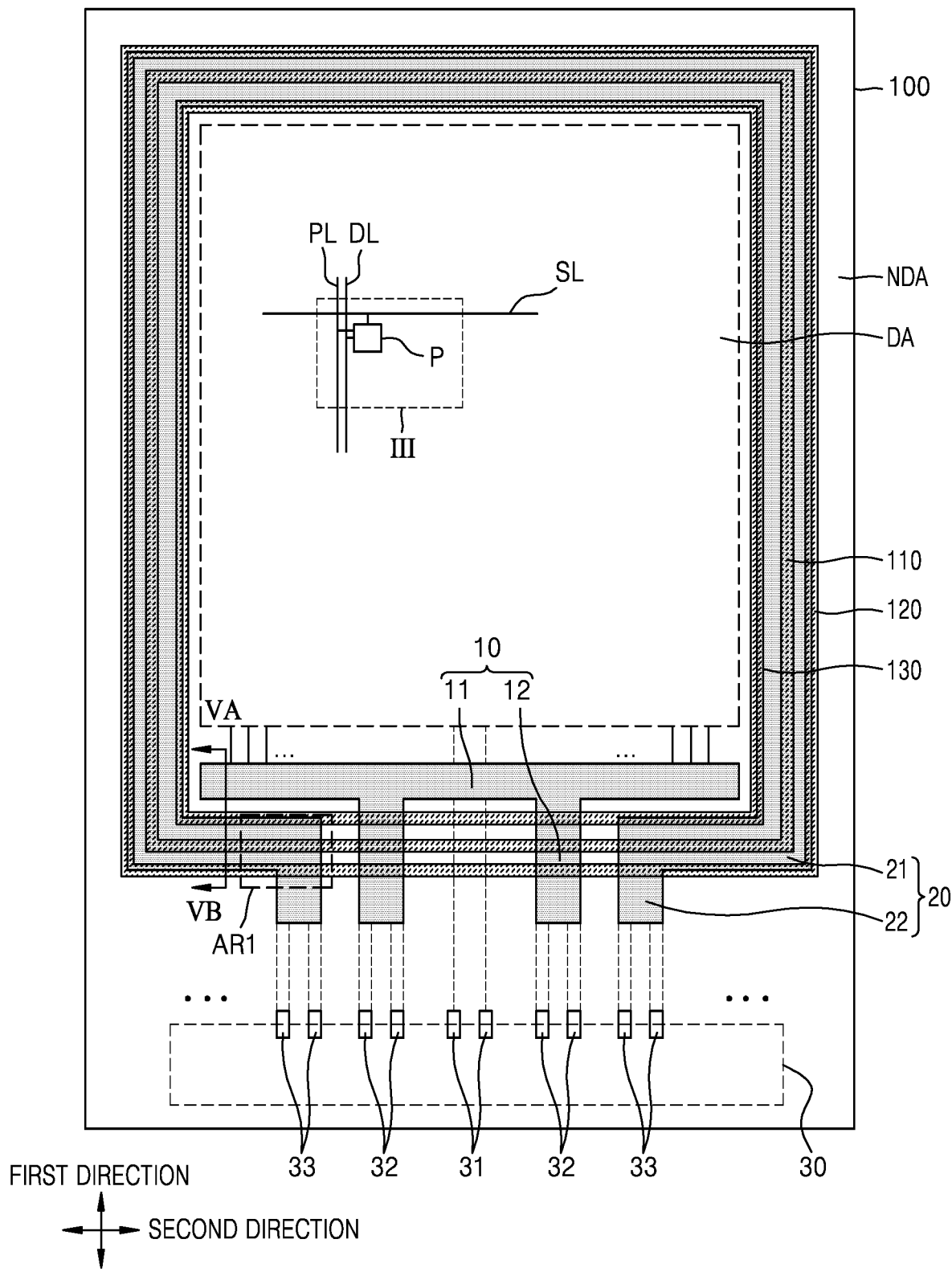
FIG. 1 is a plan view of a display apparatus according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description.

Hereinafter, the disclosure will be described in detail by explaining embodiments of the disclosure with reference to the attached drawings, and like reference numerals in the drawings denote like elements and thus a repeated explanation will not be given.

Some of the parts which are not associated with the description may not be provided in order to describe embodiments of the disclosure and like reference numerals refer to like elements throughout the specification.

It will be understood that although the terms "first", "second", "third", for example, may be used herein to describe various elements, these elements should not be limited by these terms, and these elements are only used to distinguish one element from another.

As used herein, the singular forms "a", "an", and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it may be directly formed on the other layer, region, or component or may be indirectly formed with intervening layers, regions, or components therebetween.

Sizes of components in the drawings may be exaggerated for convenience of explanation. In other words, because sizes and thicknesses of components in the drawings are arbitrarily illustrated for convenience of explanation, the following embodiments are not limited thereto.

Further, in the specification, the phrase "in a plan view" means when an object portion is viewed from above, and the phrase "in a schematic cross-sectional view" means when a schematic cross-section taken by vertically cutting an object portion is viewed from the side.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

When an embodiment may be implemented differently, a specific process order may be different from the described order. For example, two consecutively described processes may be performed substantially at the same time or performed in an order opposite to the described order.

It will be understood that when a layer, region, or element is referred to as being "connected", the layer, region, or element may be directly connected or may be indirectly connected with intervening layers, regions, or elements therebetween. For example, when a layer, region, or element is electrically connected, the layer, region or element may be directly electrically connected or may be indirectly electrically connected with intervening layers, regions, or elements therebetween.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Examples of a display apparatus for displaying an image may include a liquid crystal display, an electrophoretic display, an organic light-emitting display, an inorganic electroluminescent (EL) display, a field emission display, a surface-conduction electron-emitter display, a plasma display, and a cathode ray tube display.

Although an organic light-emitting display may be described as a display apparatus according to an embodiment, the disclosure is not limited thereto and various display apparatuses may be applicable within the spirit and scope of the disclosure.

Figure 2A:
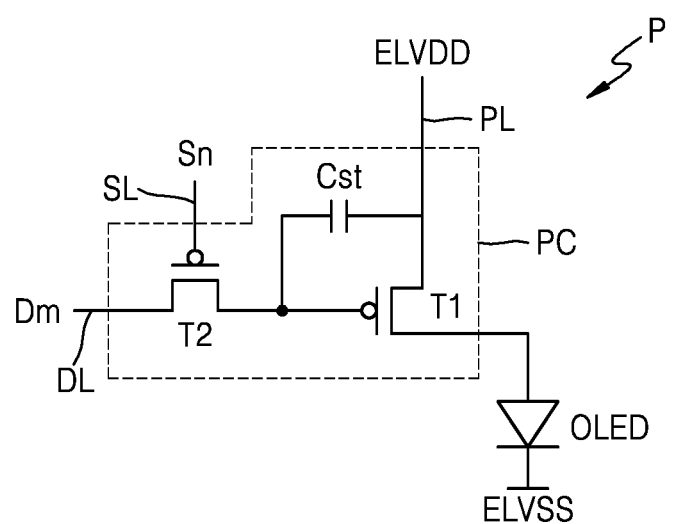
FIGS. 2A and 2B are equivalent circuit diagrams illustrating a pixel included in the display apparatus according to an embodiment.
Figure 2B:
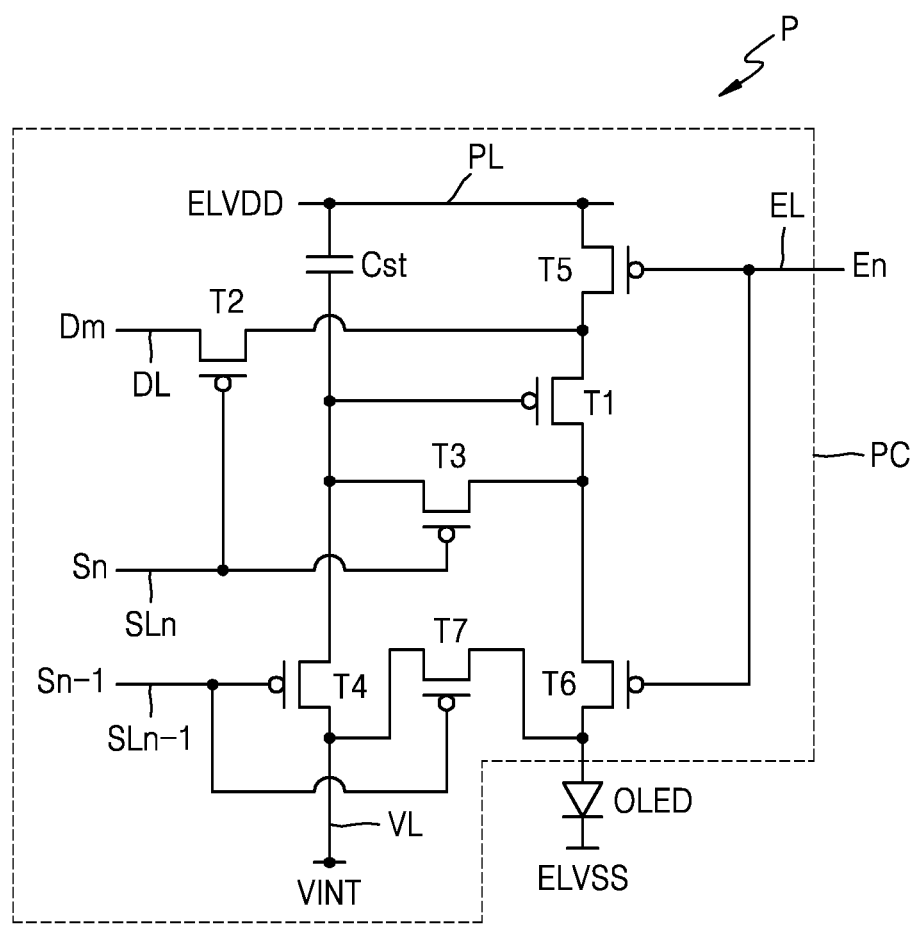
Figure 3:
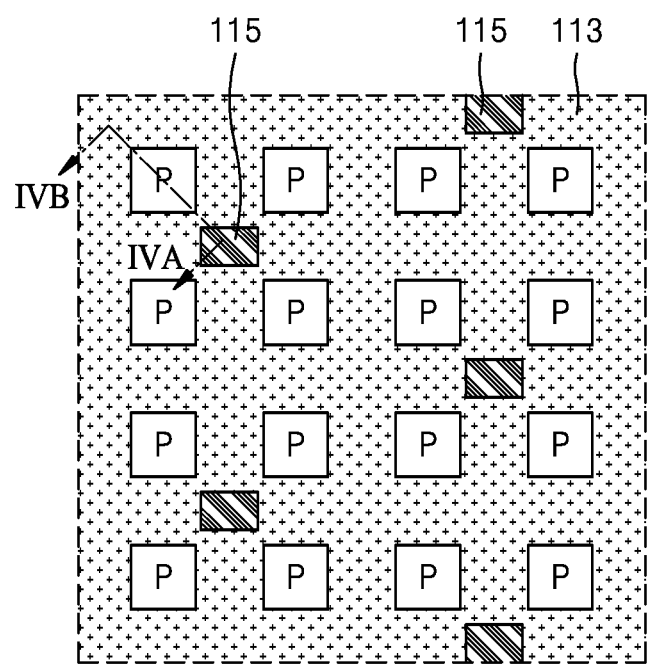
FIG. 3 is a plan view illustrating portion III of FIG. 1.
Figure 4:
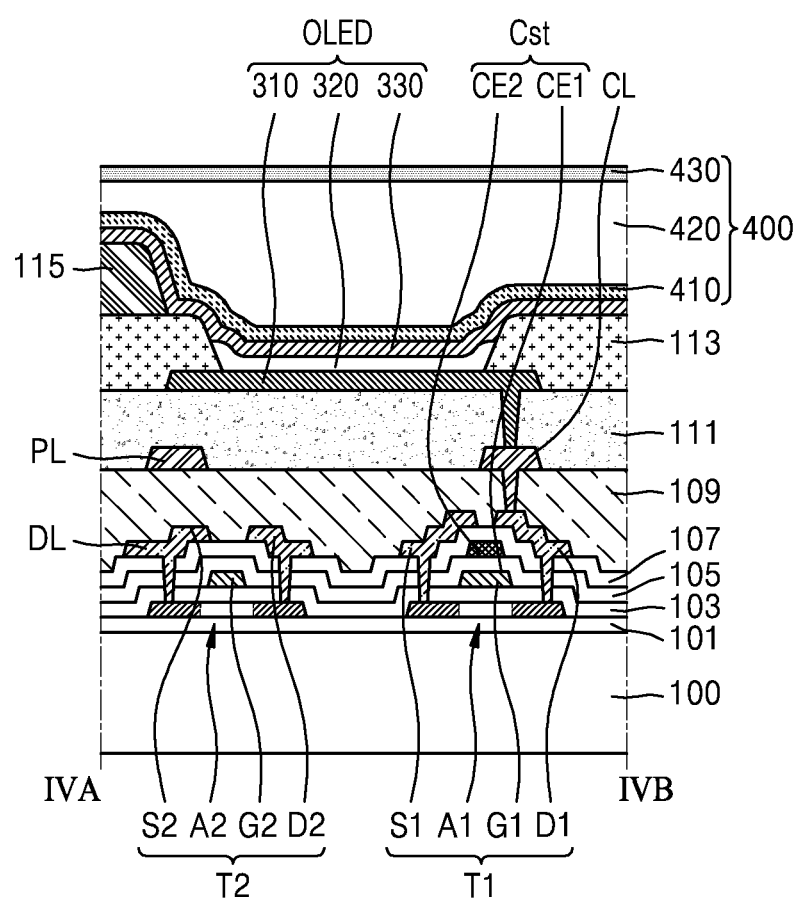
FIG. 4 is a schematic cross-sectional view illustrating a pixel included in the display apparatus of FIG. 1, taken along line IVA-IVB of FIG. 3.
Figure 5:
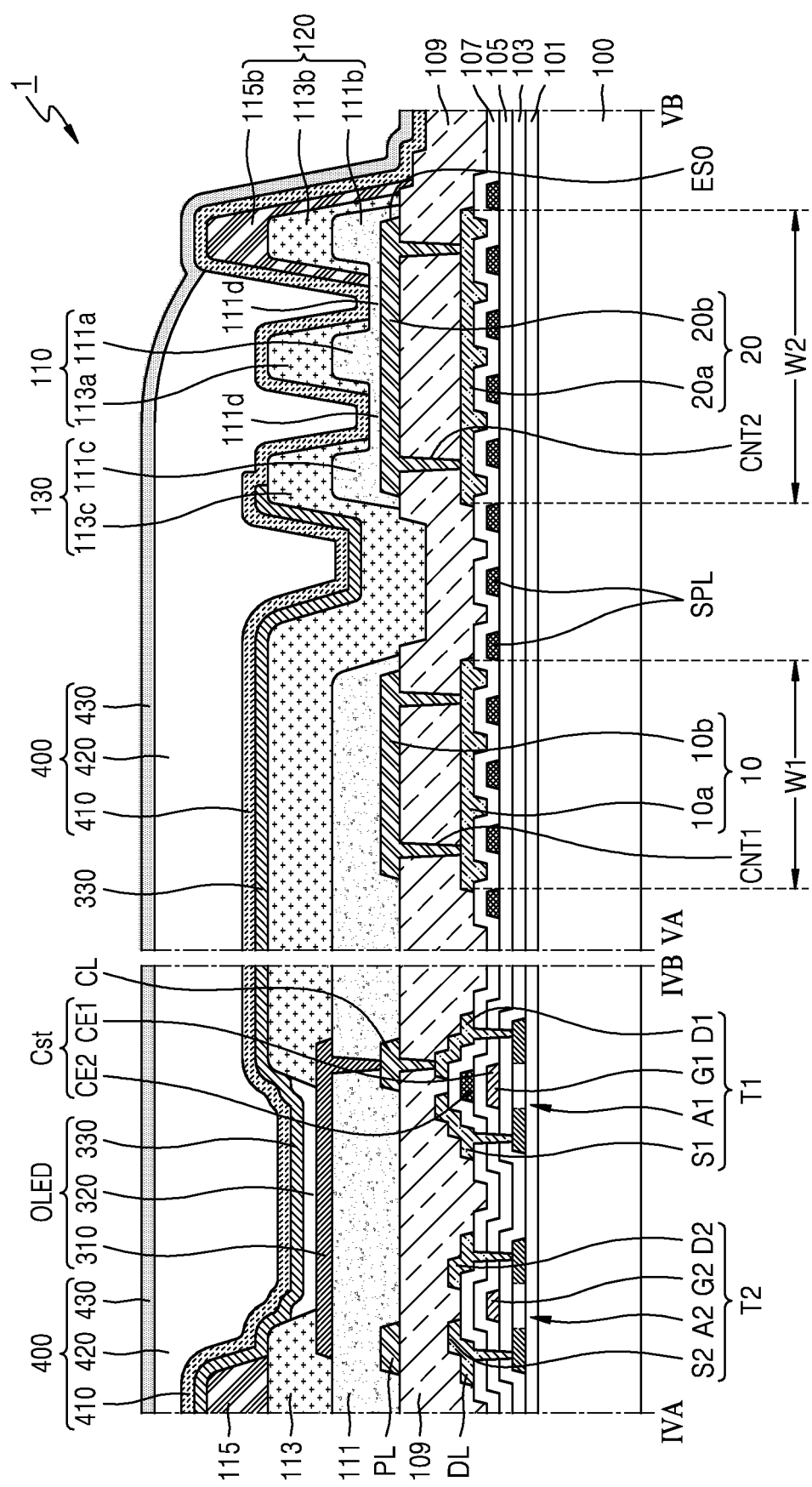
FIG. 5 is a schematic cross-sectional view of the display apparatus according to an embodiment, taken along line VA-VB of FIGS. 4 and 1.

FIG. 1 is a plan view of a display apparatus 1 according to an embodiment, FIGS. 2A and 2B are equivalent circuit diagrams illustrating a pixel included in the display apparatus 1 according to an embodiment, FIG. 3 is a plan view illustrating a portion III of FIG. 1, FIG. 4 is a cross-sectional view illustrating a pixel included in the display apparatus 1 of FIG. 1, taken along line IVA-IVB of FIG. 3, and FIG. 5 is a cross-sectional view of the display apparatus 1, taken along line VA-VB of FIGS. 4 and 1.

Referring to FIG. 1, the display apparatus 1 may include a substrate 100 including a display area DA. The display area DA may include pixels P each connected to a data line DL extending in a first direction and a scan line SL extending in a second direction. The second direction may intersect the first direction. Each pixel P may be connected to a driving voltage line PL extending in the first direction.

One pixel P may emit, for example, red, green, blue, or white light, and may include, for example, an organic light-emitting diode. Each pixel P may include devices such as a thin-film transistor (TFT) and a capacitor.

The display area DA may provide a predetermined image or images through light emitted by the pixels P, and a non-display area NDA may be located or disposed outside the display area DA. For example, the non-display area NDA may surround or be around the display area DA. The non-display area NDA may be on the periphery or the perimeter of the display area DA.

The non-display area NDA where the pixels P may not be located or disposed may not provide an image. A first power supply voltage line 10 and a second power supply voltage line 20 that may provide a voltage different from that of the first power supply voltage line 10 may be located or disposed in the non-display area NDA.

The first power supply voltage line 10 may include a first main voltage line 11 and a first connection line 12 located or disposed at a side of the display area DA. For example, when the display area DA has a rectangular shape, the first main voltage line 11 may be located or disposed to correspond to one side of the display area DA. The first connection line 12 may extend in the first direction from the first main voltage line 11. In the embodiment, the first direction may be a direction from the display area DA to a terminal unit 30 near (or at a predetermined distance from) an end portion of the substrate 100. The first connection line 12 may be connected to a first terminal 32 of the terminal unit 30.

The second power supply voltage line 20 may include a second main voltage line 21 partially surrounding both end portions of the first main voltage line 11 and the display area DA, and a second connection line 22 extending in the first direction from the second main voltage line 21. For example, when the display area DA has a rectangular shape, the second main voltage line 21 may extend along the end portions (or both end portions) of the first main voltage line 11, and sides other than a side of the display are DA that may be adjacent to the first main voltage line 11. The second connection line 22 may extend in the first direction to be parallel to the first connection line 12, and may be connected to a second terminal 33 of the terminal unit 30. The second power supply voltage line 20 may be bent to surround an end portion of the first power supply voltage line 10.

The terminal unit 30 may be located or disposed on an end portion of the substrate 100, and may include terminals (for example, a third terminal 31, the first terminal 32, and the second terminal 33). The terminal unit 30 may be exposed, that is, without being covered by an insulating layer. The terminal unit 30 may be electrically connected to a controller (not shown) such as a flexible printed circuit board or a driving driver integrated circuit (IC) chip.

The controller may convert external image signals into image data signals and transmit the image data signals to the display area DA through the third terminal 31. The controller may receive a vertical synchronization signal, a horizontal synchronization signal, and a clock signal, may generate a control signal that controls an operation of first and second gate drivers (not shown), and may transmit the control signal to a terminal (not shown).

The controller may apply different voltages to the first power supply voltage line 10 and the second power supply voltage line 20, respectively, through the first terminal 32 and the second terminal 33.

The first power supply voltage line 10 may supply a first power supply voltage ELVDD (see FIGS. 2A and 2B) to each pixel P, and the second power supply voltage line 20 may supply a second power supply voltage ELVSS (see FIGS. 2A and 2B) to each pixel P.

For example, the first power supply voltage ELVDD may be applied to each pixel P through the driving voltage line PL that may be connected to the first power supply voltage line 10. The second power supply voltage ELVSS may be applied to a cathode of an organic light-emitting device OLED (see FIGS. 2A and 2B) provided in each pixel P. In this case, the second main voltage line 21 of the second power supply voltage line 20 may be connected to the cathode of the organic light-emitting device OLED in the non-display area NDA.

Although not shown in FIGS. 1 through 5, a scan driver that may apply a scan signal to the scan line SL of each pixel P and a data driver that may apply a data signal to the data line DL may be located or disposed in the non-display area NDA.

A first dam portion 110, a second dam portion 120, and a third dam portion 130 that may surround the display area DA may be located or disposed in the non-display area NDA. The first dam portion 110, the second dam portion 120, and the third dam portion 130 may be spaced apart from one another.

When an organic encapsulation layer 420 (see FIG. 4) including an organic material such as a monomer may be formed by using an inkjet process, the first dam portion 110 and the second dam portion 120 may function as dams that may prevent the organic material from flowing to an edge of the substrate 100. Thus, an edge tail may be prevented from being formed due to the organic encapsulation layer 420 at the edge of the substrate 100. The first dam portion 110 and the second dam portion 120 may be disposed adjacent to each other and outside of each other.

The organic material of the organic encapsulation layer 420 may flow beyond the first dam portion 110 and the second dam portion 120 to an edge of the substrate 100 even with, or in spite of, the first dam portion 110 and the second dam portion 120. For example, when the second dam portion 120 may be located or disposed closer to the first dam portion 110 from an edge of the substrate 100 to reduce the area of a dead space seen from the outside or the first dam portion 110 may be located or disposed closer to the second dam portion 120 to increase the display area DA, an interval between the first dam portion 110 and the second dam portion 120 may be reduced and the organic material of the organic encapsulation layer 420 may flow beyond the second dam portion 120. An edge tail may be formed when the organic material overflows. The edge tail may become a path through which external impurities may be introduced and may cause defects of the organic light-emitting device OLED. Accordingly, as a dead space is reduced, it may become more important to reduce the overflow of an organic material and control the amount of an overflowing organic material. The third dam portion 130 located or disposed between the display area DA and the first dam portion 110 may reduce a reflow velocity of the organic material and may reduce the amount of the organic material flowing to the first dam portion 110. It is to be understood that the indication of first, second, and third with respect to the dam portions is arbitrary and for ease of description. The dam portions may be any of first, second, and third dam portions without departing from the spirit and scope of the disclosure. The dam portions 110, 120, and 130 may serve as barriers, receptacles, or reservoirs for reducing or preventing the overflow of the organic material.

Referring to FIG. 2A, each pixel P may include a pixel circuit PC connected to the scan line SL and the data line DL and the organic light-emitting device OLED connected to the pixel circuit PC.

The pixel circuit PC may include a driving TFT T1, a switching TFT T2, and a storage capacitor Cst. The switching TFT T2 may transmit, to the driving TFT T1, a data signal Dm input through the data line DL according to a first scan signal Sn input through the scan line SL.

The storage capacitor Cst may be connected to the switching TFT T2 and the driving voltage line PL, and may store a voltage corresponding to a difference between a voltage received from the switching TFT T2 and the first power supply voltage ELVDD (or a driving voltage) applied to the driving voltage line PL.

The driving TFT T1 may be connected to the driving voltage line PL and the storage capacitor Cst, and may control driving current flowing from the driving voltage line PL to the organic light-emitting device OLED in response to a value of the voltage stored in the storage capacitor Cst. The organic light-emitting device OLED may emit light having a predetermined luminance due to the driving current.

Although the pixel circuit PC includes two TFTs and one storage capacitor in FIG. 2A, the disclosure is not limited thereto.

Referring to FIG. 2B, the pixel circuit PC may include the driving and switching TFTs T1 and T2, respectively, a compensation TFT T3, a first initialization TFT T4, a first emission control TFT T5, a second emission control TFT T6, and a second initialization TFT T7.

Although signal lines (for example, a first scan line SLn, a second scan line SLn-1, an emission control line EL, and the data line DL), an initialization voltage line VL, and the driving voltage line PL may be provided for each pixel P in FIG. 2B, the disclosure is not limited thereto. In an embodiment, at least one of the signal lines and/or the initialization voltage line VL may be shared by adjacent pixels.

A drain electrode of the driving TFT T1 may be electrically connected to the organic light-emitting device OELD through the second emission control TFT T6. The driving TFT T1 may receive the data signal Dm according to a switching operation of the switching TFT T2 and apply a driving current to the organic light-emitting device OLED.

A gate electrode of the switching TFT T2 may be connected to the first scan line SLn and a source electrode of the switching TFT T2 may be connected to the data line DL. A drain electrode of the switching TFT T2 may be connected to a source electrode of the driving TFT T1, and may be connected to the driving voltage line PL through the first emission control TFT T5.

The switching TFT T2 may be turned on according to the first scan signal Sn received through the first scan line SLn and perform a switching operation of transmitting the data signal Dm transmitted to the data line DL to the source electrode of the driving TFT T1.

A gate electrode of the compensation TFT T3 may be connected to the first scan line SLn. A source electrode of the compensation TFT T3 may be connected to the drain electrode of the driving TFT T1 and may be connected to a pixel electrode of the organic light-emitting device OLED through the second emission control TFT T6. A drain electrode of the compensation TFT T3 may be connected to one electrode of the storage capacitor Cst, a source electrode of the first initialization TFT T4, and a gate electrode of the driving TFT T1. The compensation TFT T3 may be turned on according to the first scan signal Sn received through the first scan line SL and may diode-connect the driving TFT T1 by connecting the gate electrode and the drain electrode of the driving TFT T1.

A gate electrode of the first initialization TFT T4 may be connected to the second scan line SLn-1 (for example, a previous scan line). A drain electrode of the first initialization TFT T4 may be connected to the initialization voltage line VL. The source electrode of the first initialization TFT T4 may be connected to one electrode of the storage capacitor Cst, the drain electrode of the compensation TFT T3, and the gate electrode of the driving TFT T1. The first initialization TFT T4 may be turned on according to a second a scan signal Sn-1 received through the second scan line SLn-1 and may perform an initialization operation of initializing a voltage of the gate electrode of the driving TFT T1 by supplying an initialization voltage VINT to the gate electrode of the driving TFT T1.

A gate electrode of the first emission control TFT T5 may be connected to the emission control line EL. A source electrode of the first emission control TFT T5 may be connected to the driving voltage line PL. A drain electrode of the first emission control TFT T5 may be connected to the source electrode of the driving TFT T1 and the drain electrode of the switching TFT T2.

A gate electrode of the second emission control TFT T6 may be connected to the emission control line EL. A source electrode of the second emission control TFT T6 may be connected to the drain electrode of the driving TFT T1 and the source electrode of the compensation TFT T3. A drain electrode of the second emission control TFT T6 may be electrically connected to the pixel electrode of the organic light-emitting device OLED. The first emission control TFT T5 and the second emission control TFT T6 may be turned on according to an emission control signal En received through the emission control line EL. The first power supply voltage ELVDD may be applied to the organic light-emitting device OLED, and driving current may flow through the organic light-emitting device OLED.

A gate electrode of the second initialization TFT T7 may be connected to the second scan line SLn-1. A source electrode of the second initialization TFT T7 may be connected to the pixel electrode of the organic light-emitting device OLED. A drain electrode of the second initialization TFT T7 may be connected to the initialization voltage line VL. The second initialization TFT T7 may be turned on according to the second scan signal Sn-1 received through the second scan line SLn-1 and may initialize the pixel electrode of the organic light-emitting device OLED.

Although the first initialization TFT T4 and the second initialization TFT T7 may be connected to the second scan line SLn-1 in FIG. 2B, the disclosure is not limited thereto. In an embodiment, the first initialization TFT T4 may be connected to the second scan line SLn-1, that is, a previous scan line and may be driven according to the second scan signal Sn-1. The second initialization TFT T7 may be connected to a separate signal line (for example, a next scan line) and may be driven according to a signal transmitted to the next scan line.

An electrode of the storage capacitor Cst may be connected to the driving voltage line PL. Any one electrode of the storage capacitor Cst may be connected to the gate electrode of the driving TFT T1, the drain electrode of the compensation TFT T3, and the source electrode of the first initialization TFT T4.

A counter electrode (for example, a cathode) of the organic light-emitting device OLED may receive the second power supply voltage ELVSS (or a common power supply voltage). The organic light-emitting device OLED may receive driving current from the driving TFT T1 and emit light.

The number of TFTs and storage capacitors and a circuit design of the pixel circuit PC are not limited to those as illustrated in FIGS. 2A and 2B and may be modified in various ways within the spirit and scope of the disclosure.

Referring to FIGS. 3 and 4, the portion III of FIG. 1 and the driving and switching TFTs T1 and T2 and the storage capacitor Cst of the pixel circuit PC of each pixel P of FIGS. 2A and 2B will be described in more detail.

Referring to FIG. 3, the pixels P may be located or disposed in the portion III of FIG. 1. The pixels P may be surrounded by a pixel-defining film 113, and a spacer 115, or spacers, may be located or disposed on the pixel-defining film 113.

Although the pixels P are illustrated as having quadrangular shapes of the same or similar size in FIG. 3, this is merely an example. The pixels P may have different sizes and may have different shapes.

The spacer 115 (or spacers) may be located or disposed between some pixels P (or a predetermined number of pixels P) of the pixels P. The spacer 115 may prevent an intermediate layer 320 from being damaged or scratched by a mask by maintaining a gap between the mask and the substrate 100 in a process of depositing the intermediate layer 320 by using the mask.

The spacer 115 may include the same or similar material as that of the pixel-defining film 113. The spacer 115 and the pixel-defining film 113 may include a same or similar material. The spacer 115 may be formed to have a height different from that of the pixel-defining film 113 when the pixel-defining film 113 may be formed by using a halftone mask.

Referring to FIG. 4, a buffer layer 101 may be located or disposed on the substrate 100, and the driving TFT T1, the switching TFT T2, and the storage capacitor Cst may be located or disposed on the buffer layer 101.

The substrate 100 may be formed of any of various materials such as glass, metal, or plastic. For example, the substrate 100 may be a flexible substrate including a polymer resin such as polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP).

The buffer layer 101 may be formed of silicon oxide ($SiO_x$) and/or silicon nitride ($SiN_x$) to prevent penetration of impurities that may be provided or introduced on the substrate 100.

The driving TFT T1 may include a driving semiconductor layer A1 and a driving gate electrode G1, and the switching TFT T2 may include a switching semiconductor layer A2 and a switching gate electrode G2. A first gate insulating layer 103 may be located or disposed between the driving semiconductor layer A1 and the driving gate electrode G1 and between the switching semiconductor layer A2 and the switching gate electrode G2. The first gate insulating layer 103 may include an inorganic insulating material such as $SiO_x$, $SiN_x$, or silicon oxynitride (SiON).

Each of the driving semiconductor layer A1 and the switching semiconductor layer A2 may include amorphous silicon or polycrystalline silicon. In an embodiment, each of the driving semiconductor layer A1 and the switching semiconductor layer A2 may include at least one oxide selected from the group consisting of indium (In), gallium (Ga), stannum/tin (Sn), zirconium (Zr), vanadium (V), hafnium (Hf), cadmium (Cd), germanium (Ge), chromium (Cr), titanium (Ti), and zinc (Zn).

The driving semiconductor layer A1 may overlap the driving gate electrode G1 and include a driving channel region not doped with impurities and a driving source region and a driving drain region located or disposed at both (or opposite) sides of the driving channel region and doped with impurities. A driving source electrode S1 and a driving drain electrode D1 may be respectively connected to the driving source region and the driving drain region.

The switching semiconductor layer A2 may overlap the switching gate electrode G2 and may include a switching channel region not doped with impurities and a switching source region and a switching drain region located or disposed at both (or opposite) sides of the switching channel region and doped with impurities. A switching source electrode S2 and a switching drain electrode D2 may be respectively connected to the switching source region and the switching drain region.

Each of the driving gate electrode G1 and the switching gate electrode G2 may include molybdenum (Mo), aluminum (Al), copper (Cu), or titanium (Ti) and may have a single or multi-layer structure.

In an embodiment, the storage capacitor Cst may overlap the driving TFT T1. In this case, the area of each of the storage capacitor Cst and the driving TFT T1 may be increased and a high-quality image may be provided or realized. For example, the driving gate electrode G1 may be a first storage capacitor plate CE1 of the storage capacitor Cst. A second storage capacitor plate CE2 may overlap the first storage capacitor plate CE1 with a second gate insulating layer 105 between the second storage capacitor plate CE2 and the first storage capacitor plate CE1. The second gate insulating layer 105 may include an inorganic insulating material such as $SiO_x$, $SiN_x$, or SiON.

The driving TFT T1, the switching TFT T2, and the storage capacitor Cst may be covered by an interlayer insulating layer 107.

The interlayer insulating layer 107 may be an inorganic layer formed of SiON, $SiO_x$, and/or $SiN_x$.

The data line DL may be located or disposed on the interlayer insulating layer 107, and may be connected to the switching semiconductor layer A2 of the switching TFT T2 through a contact hole formed in the interlayer insulating layer 107. The data line DL may function as the switching source electrode S2.

The driving source electrode S1, the driving drain electrode D1, the switching source electrode S2, and the switching drain electrode D2 may be located or disposed on the interlayer insulating layer 107, and may be connected to the driving semiconductor layer A1 or the switching semiconductor layer A2 through a contact hole formed in the interlayer insulating layer 107.

Although not illustrated, the data line DL, the driving source electrode S1, the driving drain electrode D1, the switching source electrode S2, and the switching drain electrode D2 may be covered by an inorganic protective layer.

The inorganic protective layer may have a single or multi-layer structure including $SiN_x$ and $SiO_x$. The inorganic protective layer may prevent some exposed wirings in the non-display area NDA, for example, wirings formed in the same process as that of the data line DL, from being damaged by an etchant used during patterning of the pixel electrode 310.

The driving voltage line PL and the data line DL may be located or disposed on different layers. When 'A and B are located or disposed on different layers', it means that at least one insulating layer may be located or disposed between A and B so that one of A and B may be located or disposed under or below the at least one insulating layer and the other may be located or disposed over or above the at least one insulating layer. A first planarization film 109 may be located or disposed between the driving voltage line PL and the data line DL, and the driving voltage line PL may be covered by a second planarization film 111.

The driving voltage line PL may have a single or multi-layer structure including at least one of Al, Cu, Ti, or an alloy thereof. In an embodiment, the driving voltage line PL may have a three-layer structure including TiAl/Ti.

Although the driving voltage line PL may be located or disposed on the first planarization film 109 in FIG. 4, the disclosure is not limited thereto. In an embodiment, the driving voltage line PL may be connected to a lower additional voltage line (not shown) formed on the same layer as that of the data line DL through a through-hole (not shown) formed in the first planarization film 109 to reduce resistance.

Each of the first planarization film 109 and the second planarization film 111 may have a single or multi-layer structure.

Each of the first planarization film 109 and the second planarization film 111 may include an organic insulating material. For example, the organic insulating material may include an organic insulating material such as a general-purpose polymer (for example, polymethyl methacrylate (PMMA) or polystyrene (PS)), a polymer derivative having a phenol-based group, an acrylic polymer, an aryl ether-based polymer, an amide-based polymer, a fluorinated polymer, a p-xylene-based polymer, or a vinyl alcohol-based polymer.

Also, each of the first planarization film 109 and the second planarization film 111 may include an inorganic insulating material. For example, the inorganic insulating material may include SiON, $SiO_x$, or $SiN_x$.

The organic light-emitting device OLED may include a pixel electrode 310, a counter electrode 330, and an intermediate layer 320 located or disposed between the pixel electrode 310 and the counter electrode 330 and may include an emission layer that may be located or disposed on the second planarization film 111.

The pixel electrode 310 may be connected to a connection wiring CL formed on the first planarization film 109, and the connection wiring CL may be connected to the driving drain electrode D1 of the driving TFT T1.

The pixel electrode 310 may be a transparent electrode or a reflective electrode.

When the pixel electrode 310 is a transparent electrode, the pixel electrode 310 may include a transparent conductive layer. The transparent conductive layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). The pixel electrode 310 may include a semi-transmitting layer for improving light efficiency in addition to the transparent conductive layer, and the semi-transmitting layer may include at least one selected from the group consisting of silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and ytterbium (Yb) and may be formed as a film having a thickness in a range of about several to tens of micrometers (μm).

When the pixel electrode 310 is a reflective electrode, the pixel electrode 310 may include a reflective film formed of Ag, Mg, Al, Pt, Pd, Au, Ni, Nd, Ir, Cr, or a compound thereof and a transparent conductive layer may be located or disposed over or above and/or under or below the reflective film. The transparent conductive layer may include at least one selected from the group consisting of ITO, IZO, ZnO, $In_2O_3$, IGO, and AZO.

The disclosure is not limited thereto, and various modifications may be made. For example, the pixel electrode 310 may be formed of any of various materials and may have a single or multi-layer structure.

The pixel-defining film 113 may be located or disposed on the pixel electrode 310.

The pixel-defining film 113 may have an opening through which the pixel electrode 310 may be exposed and may define the pixel P. The pixel-defining film 113 may prevent an arc from occurring on an end portion of the pixel electrode 310 by increasing a distance between an edge of the pixel electrode 310 and the counter electrode 330. The pixel-defining film 113 may be formed of an organic material such as, for example, PI or hexamethyldisiloxane (HMDSO).

The intermediate layer 320 may include a low molecular weight material or a high molecular weight material.

When the intermediate layer 320 includes a low molecular weight material, the intermediate layer 320 may have a single or stacked structure including a hole injection layer, a hole transport layer, an emission layer, an electron transport layer, and an electron injection layer. The intermediate layer 320 may include any of various organic materials such as copper phthalocyanine (CuPc), N,N'-Di(naphthalene-1-yl)-N,N'-diphenyl-benzidine (NPB), or tris-8-hydroxyquinoline aluminum (Alq3). The intermediate layer 320 may be formed by using any of various methods such as vapor deposition, by way of example.

When the intermediate layer 320 includes a high molecular weight material, the intermediate layer 320 may have a structure including a hole transport layer and an emission layer. For example, the hole transport layer may include poly(3,4-ethylenedioxythiophene) (PEDOT), and the emission layer may include a high molecular weight material such as a poly-phenylenevinylene (PPV)-based material or a polyfluorene-based material. The intermediate layer 320 may be formed by using any of various methods such as screen printing, inkjet printing, or laser-induced thermal imaging, for example.

The intermediate layer 320 may be integrally formed over the pixel electrodes 310, or may be formed as a layer patterned to correspond to each of the pixel electrodes 310.

The counter electrode 330 may be located or disposed over the display area DA to cover the display area DA. For example, the counter electrode 330 may be integrally formed over the organic light-emitting devices OLED and may correspond to the pixel electrodes 310. The counter electrode 330 may be electrically connected to the power supply line 20.

The counter electrode 330 may be a transparent electrode or a reflective electrode. When the counter electrode 330 is a transparent electrode, the counter electrode 330 may include at least one material selected from among Ag, Al, Mg, Li, Ca, Cu, LiF/Ca, LiF/Al, MgAg, and CaAg, and may be formed as a thin film having a thickness in a range of about several to tens of micrometers (μm).

When the counter electrode 330 is a reflective electrode, the counter electrode 330 may be formed of at least one selected from the group consisting of Ag, Al, Mg, Li, Ca, Cu, LiF/Ca, LiF/Al, MgAg, and CaAg. A configuration or structure and a material of the counter electrode 330 are not limited thereto, however, and various modifications may be made within the spirit and scope of the disclosure.

The spacer 115 may be located or disposed on the pixel-defining film 113. The spacer 115 may protrude from the pixel-defining film 113 to a thin-film encapsulation layer 400, and may prevent the intermediate layer 320 from being damaged or scratched by a mask by maintaining a gap between the mask and the substrate 100 in a process of depositing the intermediate layer 320 including the emission layer by using the mask.

The spacer 115 may be formed of an organic material such as PI or HMDSO. The spacer 115 may be located or disposed on at least one of the first through third dam portions 110, 120, and 130 and may be used to prevent penetration of moisture and to form a stepped portion of a dam portion.

Because the organic light-emitting device OLED may be easily damaged by external moisture or oxygen, the organic light-emitting device OLED may be covered and protected by the thin-film encapsulation layer 400.

The thin-film encapsulation layer 400 may cover the display area DA and may extend to the outside of the display area DA. The thin-film encapsulation layer 400 may include at least one organic encapsulation layer and at least one inorganic encapsulation layer. In an embodiment, the thin-film encapsulation layer 400 may include a first inorganic encapsulation layer 410, the organic encapsulation layer 420, and a second inorganic encapsulation layer 430.

The first inorganic encapsulation layer 410 may cover (or may entirely cover) the counter electrode 330 and may include $SiO_x$, $SiN_x$, and/or SiON.

By way of example, other layers such as a capping layer (not shown) may be located or disposed between the first inorganic encapsulation layer 410 and the counter electrode 330. For example, in order to improve light efficiency, the capping layer may include at least one organic material or inorganic material from among $SiO_2$, $SiN_x$, zinc oxide ($ZnO_2$), titanium oxide ($TiO_2$), zirconium oxide ($ZrO_2$), ITO, IZO, $Alq_3$, CuPc, CBP, a-NPB, and $ZiO_2$. In an embodiment, the capping layer may cause plasmon resonance with respect to light generated by the organic light-emitting device OLED. For example, the capping layer may include nanoparticles. The capping layer may prevent damage to the organic light-emitting device OLED due to heat or plasma generated in a sputtering process or a chemical vapor deposition process for forming the thin-film encapsulation layer 400. For example, the capping layer may include an epoxy-based material including at least one of a bisphenol-type epoxy resin, an epoxidized butadiene resin, a fluorine-type epoxy resin, and a novolac epoxy resin.

As an example, a layer (not shown) including LiF may be located or disposed between the first inorganic encapsulation layer 410 and the capping layer.

Because the first inorganic encapsulation layer 410 may be formed along a lower structure which may have various layers or be uneven, as illustrated for example in FIGS. 4 and 5, a top surface of the first inorganic encapsulation layer 410 may not be flat. The organic encapsulation layer 420 may cover the first inorganic encapsulation layer 410. The organic encapsulation layer 420 may have a flat top surface. The organic encapsulation layer 420 may be formed so that a portion corresponding to the display area DA may have a top surface.

The organic encapsulation layer 420 may include PET, PEN, PC, PI, polyethylene sulfonate, polyoxymethylene, polyarylate, HMDSO, an acrylic resin (for example, PMMA or polyacrylic acid), or a combination thereof.

The second inorganic encapsulation layer 430 may cover the organic encapsulation layer 420 and may include $SiO_x$, $SiN_x$, and/or SiON. A second inorganic layer may be deposited on an edge portion of the display apparatus 1 to contact (or directly contact) a first inorganic layer, thereby preventing an organic layer from being exposed to the outside of the display apparatus 1.

Referring to FIG. 5, a left view illustrates a structure of the pixel P and a right view is a schematic cross-sectional view taken along line VA-VB of FIG. 1.

In a portion VA-VB, the buffer layer 101, the first gate insulating layer 103, the second gate insulating layer 105, the interlayer insulating layer 107, and the first planarization film 109 extending in the display area DA may be located or disposed on the substrate 100. Spider wirings SPL may be located or disposed between the second gate insulating layer 105 and the interlayer insulating layer 107. A first conductive layer 10a and a third conductive layer 20a may be located or disposed on the interlayer insulating layer 107, and a second conductive layer 10b and a fourth conductive layer 20b may be located or disposed on the first planarization film 109.

The first conductive layer 10a and the second conductive layer 10b may be connected to each other through first contact holes CNT1 formed in the interlayer insulating layer 107 and may constitute the first power supply voltage line 10 that supplies the first power supply voltage ELVDD (see FIGS. 2A and 2B) to each pixel P. Because the first power supply voltage line 10 may be formed to have a two-layer structure, a width of the first power supply voltage line 10 may be reduced and a dead space may be reduced. Although two first contact holes CNT1 may be illustrated in FIG. 5, this is merely an example and the number of the first contact holes CNT1 may be one, or three or more.

The third conductive layer 20a and the fourth conductive layer 20b may be connected to each other through second contact holes CNT2 formed in the interlayer insulating layer 107 and may constitute the second power supply voltage line 20 that supplies the second power supply voltage ELVSS (see FIGS. 2A and 2B) to each pixel P. Because the second power supply voltage line 20 may be formed to have a two-layer structure, a width of the second power supply voltage line 20 may be reduced and a dead space may be reduced. Although two second contact holes CNT2 may be illustrated in FIG. 5, this is merely an example and the number of the second contact holes CNT2 may be one, or three or more.

The first conductive layer 10a and the third conductive layer 20a may be formed of the same or similar material as that of the data line DL. The first conducive layer 10a, the third conductive layer 20a, and the data line DL may include a same or similar material. The second conductive layer 10b and the fourth conductive layer 20b may be formed of the same or similar material as that of the driving voltage line PL. The second conductive layer 10b, the fourth conductive layer 20b, and the driving voltage line PL may include a same or similar material.

The second planarization film 111 may be located or disposed on the second conductive layer 10b and the pixel-defining film 113 may be located or disposed on the second planarization film 111, to overlap the first power supply voltage line 10. The counter electrode 330 extending in the display area DA may be located or disposed on the pixel-defining film 113.

The third dam portion 130, the first dam portion 110, and the second dam portion 120 extending in the display area DA to an end portion of the substrate 100 may be sequentially located or disposed to overlap the second power supply voltage line 20.

The third dam portion 130 may include a first layer 111*c* formed of the same or similar material as that of the second planarization film 111, and a second layer 113*c* may be formed of the same or similar material as that of the pixel-defining film 113. The first layer 111*c* and the second planarization film 111 may include a same or similar material. The second layer 113*c* and the pixel-defining film 113 may include a same or similar material. The second layer 113*c* of the third dam portion 130 may clad a top surface and a side surface or side surfaces of the first layer 111*c* and may secure a process margin during patterning of the second layer 113*c* in a photolithography process, thereby stably securing a height of the second layer 113*c*.

A part of the third dam portion 130 may overlap a portion of the counter electrode 330 extending in the display area DA. Noise by wirings which may affect a touch sensing layer (not shown) formed on the thin-film encapsulation layer 400 may be avoided because an end portion of the counter electrode 330 extends to the second power supply voltage line 20.

The first dam portion 110 may include a first layer 111*a* formed of the same or similar material as that of the second planarization film 111 or the first layer 111*a* may include a part of the second planarization film 111 and a second layer 113*a* may be formed of the same or similar material as that of the pixel-defining film 113 or the second layer 113*a* may include a part of the pixel-defining film 113. The first layer 111*a* and the second planarization film 111 may include a same or similar material. The second layer 113*a* and the pixel-defining film 113 may include a same or similar material. The second layer 113*a* of the first dam portion 110 may clad a top surface and a side surface or side surfaces of the first layer 111*a* and may secure a process margin during patterning of the second layer 113*a* in a photolithography process, thereby stably securing a height of the second layer 113*a*.

The second dam portion 120 may include a first layer 111*b* formed of the same or similar material as that of the second planarization film 111, a second layer 113*b* may be formed of the same or similar material as that of the pixel-defining film 113, and a third layer 115*b* may be formed of the same or similar material as that of the spacer 115. The first layer 111*b* and the second planarization film 111 may include a same or similar material. The second layer 113*b* and the pixel-defining film 113 may include a same or similar material. The third layer 115*b* and the spacer 115 may include a same or similar material. The second layer 113*b* of the second dam portion 120 may clad a top surface and a side surface or side surfaces of the first layer 111*b* and may secure a process margin during patterning of the second layer 113*b* in a photolithography process, thereby stably securing a height of the second layer 113*b*.

Although the third layer 115*b* of the second dam portion 120 may clad a top surface and a side surface or side surfaces of the second layer 113*b* in FIG. 5, the disclosure is not limited thereto. Because the second layer 113*b* and the third layer 115*b* of the second dam portion 120 may be formed by using a process using the same mask, the second layer 113*b* and the third layer 115*b* may be formed so that a width of a top surface of the second layer 113*b* and a width of a bottom surface of the third layer 115*b* may be substantially the same.

The organic material of the organic encapsulation layer 420 may be prevented from flowing beyond the second dam portion 120 to form an edge tail, because the second dam portion 120 and the first and third dam portions 110 and 130 may be formed so that a height of the second dam portion 120 may be greater than a height of each of the first dam portion 110 and the third dam portion 130. The intermediate layer 320 may be prevented from being damaged or scratched by the mask because a gap between a mask and the substrate 100 may be maintained in a process of depositing the intermediate layer 320 by using the mask.

A width W2 of the second power supply voltage line 20 may be greater than a width W1 of the first power supply voltage line 10 in the embodiment to reduce voltage drop, and the third dam portion 130, the first dam portion 110, and the second dam portion 120 may be stably located or disposed to overlap the second power supply voltage line 20.

The first layer 111*b* of the second dam portion 120 may clad an end or a third end portion ES0 of the fourth conductive layer 20*b* and may prevent damage to the fourth conductive layer 20*b* during wet etching of the second planarization film 111. In a schematic cross-sectional view, the end portion or the third end portion ES0 of the fourth conductive layer 20*b* may extend in a direction (the second direction) substantially parallel to a direction (the second direction, see FIG. 1) in which the first and second dam portions 110 and 120 may extend.

The first layer 111*c* of the third dam portion 130, the first layer 111*a* of the first dam portion 110, and the first layer 111*b* of the second dam portion 120 may be connected to one another by a connection layer 111*d* without being separated from one another. For example, a top surface of the fourth conductive layer 20*b* may be covered by (or entirely covered by) the connection layer 111*d*. Each of the first layer 111*c* of the third dam portion 130, the first layer 111*a* of the first dam portion 110, the first layer 111*b* of the second dam portion 120, and the connection layer 111*d* may be formed of the same or similar material as that of the second planarization film 111. The connection layer 111*d* and the second planarization film 111 may include a same or similar material.

Figure 6:
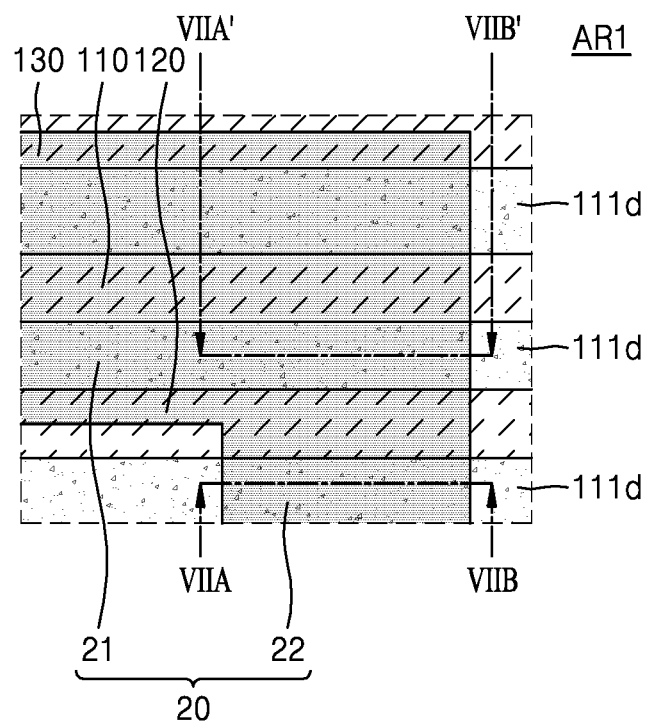
FIG. 6 is an enlarged plan view illustrating portion AR1 of FIG. 1.
Figure 7A:
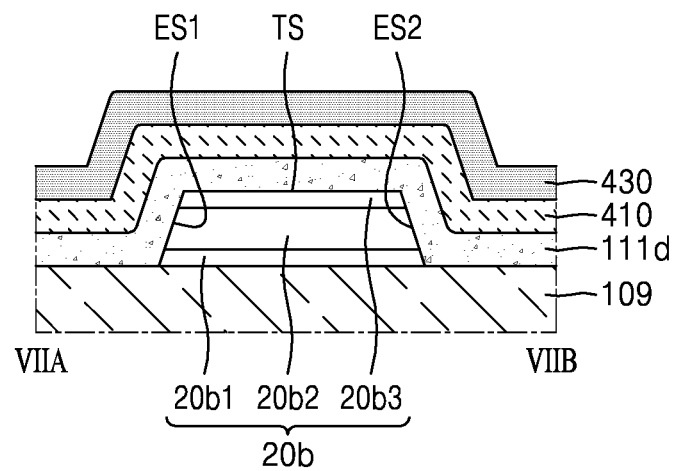
FIG. 7A is a schematic cross-sectional view taken along line VIIA-VIIB of FIG. 6.
Figure 7B:
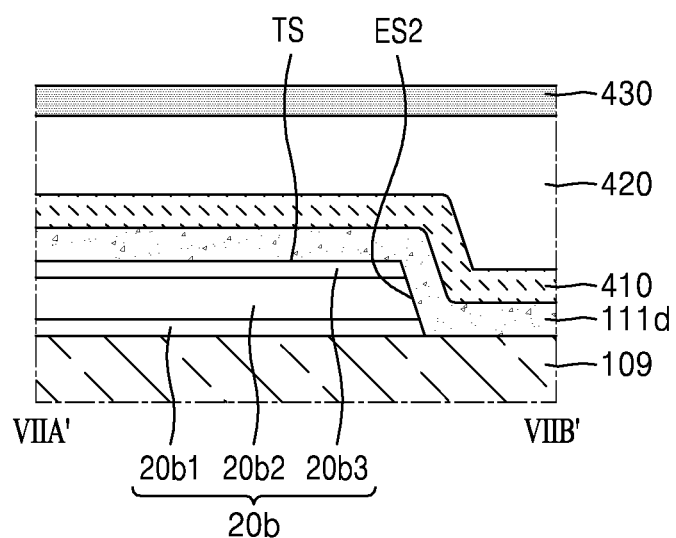
FIG. 7B is a schematic cross-sectional view taken along line VIIA'-VIIB' of FIG. 6.

FIG. 6 is an enlarged plan view illustrating a portion AR1 of FIG. 1, FIG. 7A is a schematic cross-sectional view taken along line VIIA-VIIB of FIG. 6, and FIG. 7B is a cross-sectional view taken along line VIIA'-VIIB' of FIG. 6. For convenience of explanation, the thin-film encapsulation layer 400 is not shown in a plan view of FIG. 6.

Referring to FIGS. 6, 7A, and 7B, the fourth conductive layer 20*b* of the second power supply voltage line 20 may be located or disposed on the first planarization film 109, and the connection layer 111*d* that may be formed of the same or similar material as that of the second planarization film 111 may be located or disposed on the fourth conductive layer 20*b*.

The connection layer 111*d* may be formed to have a height less than that of the second planarization film 111. The connection layer 111*d* may be formed to have a height less than that of the second planarization film 111 by etching more of a portion of the second planarization film 111 corresponding to the connection layer 111*d* when a pattern of the second planarization film 111 may be formed by using a halftone mask.

Referring to FIGS. 6 and 7A, at a second connection line 22 of the second power supply voltage line 20 located or disposed outside the second dam portion 120, a top surface TS and a first end portion ES1 and a second end portion ES2 that may be both end portions of the fourth conductive layer 20b may be covered by the connection layer 111d, and the connection layer 111d may be covered by the first inorganic encapsulation layer 410 and the second inorganic encapsulation layer 430. The first planarization film 111 and the connection layer 111d may contact or may directly contact each other, the connection layer 111d and the first inorganic encapsulation layer 410 may contact or may directly contact each other, and the first inorganic encapsulation layer 410 and the second inorganic encapsulation layer 430 may contact or may directly contact each other outside the first end portion ES1 and the second end portion ES2 of the fourth conductive layer 20b.

In a plan view, the first end portion ES1 and the second end portion ES2 of the fourth conductive layer 20b may extend in a direction (the first direction) intersecting a direction (the second direction, see FIG. 1) in which the first and second dam portions 110 and 120 may extend.

The fourth conductive layer 20b may be formed of the same or similar material as that of the driving voltage line PL. The fourth conductive layer 20b and the driving voltage line PL may include a same or similar material. In an embodiment, the fourth conductive layer 20b may have a single or multi-layer structure including at least one of Al, Cu, Ti, or an alloy thereof. For example, the fourth conductive layer 20b may be formed by stacking a first layer 20b1 including Ti, a second layer 20b2 including Al, and a third layer 20b3 including Ti which may be stacked.

A pattern of the fourth conductive layer 20b may be formed by using dry etching, and a pattern of the second planarization film 111 may be formed by using wet etching. When the second layer 20b2 includes Al and the first layer 20b1 and the third layer 20b3 include Ti, an undercut may not be formed in the first end portion ES1 and the second end portion ES2 of the fourth conductive layer 20b while the pattern of the fourth conductive layer 20b may be formed by using dry etching. However, an undercut may be formed in the first end portion ES1 and the second end portion ES2 of the fourth conductive layer 20b exposed to an etchant due to an etch rate difference between the second layer 20b2 and the first and third layers 20b1 and 20b3 while the pattern of the second planarization film 111 may be formed by using wet etching. However, in an embodiment, because the top surface TS and the first end portion ES1 and the second end portion ES2 of the fourth conductive layer 20b may be covered or may be entirely covered by the connection layer 111d with a part of the second planarization film 111 remaining, an undercut may not be formed in the first end portion ES1 and the second end portion ES2 of the fourth conductive layer 20b. Step coverage of the first inorganic encapsulation layer 410 and the second inorganic encapsulation layer 430 may be improved and penetration of moisture may be prevented because an undercut may not be formed.

Referring to FIGS. 6 and 7B, at a second main voltage line 21 of the second power supply voltage line 20, between the first dam portion 110 and the second dam portion 120, the top surface TS and the second end portion ES2 of the fourth conductive layer 20b may be covered by the connection layer 111d, and the connection layer 111d may be covered by the first inorganic encapsulation layer 410, the organic encapsulation layer 420, and the second inorganic encapsulation layer 430. The first planarization film 111 and the connection layer 111d may contact or may directly contact each other, the connection layer 111d and the first inorganic encapsulation layer 410 may contact or may directly contact each other, the first inorganic encapsulation layer 410 and the organic encapsulation layer 420 may contact or may directly contact each other, and the organic encapsulation layer 420 and the second inorganic encapsulation layer 430 may contact or may directly contact each other outside the second end portion ES2 of the fourth conductive layer 20b.

Similar to FIG. 7A, because the top surface TS and the second end portion ES2 of the fourth conductive layer 20b in which the first layer 20b1 including Ti, the second layer 20b2 including Al, and the third layer 20b3 including Ti may be stacked may be covered by or may be entirely covered by the connection layer 111d with a part of the second planarization film 111 remaining, an undercut may not be formed in the second end portion ES2 of the fourth conductive layer 20b while the pattern of the second planarization film 111 may be formed by using wet etching. Step coverage of the first inorganic encapsulation layer 410 and the second inorganic encapsulation layer 430 may be improved and penetration of moisture may be prevented because an undercut may not be formed.

Figure 8:
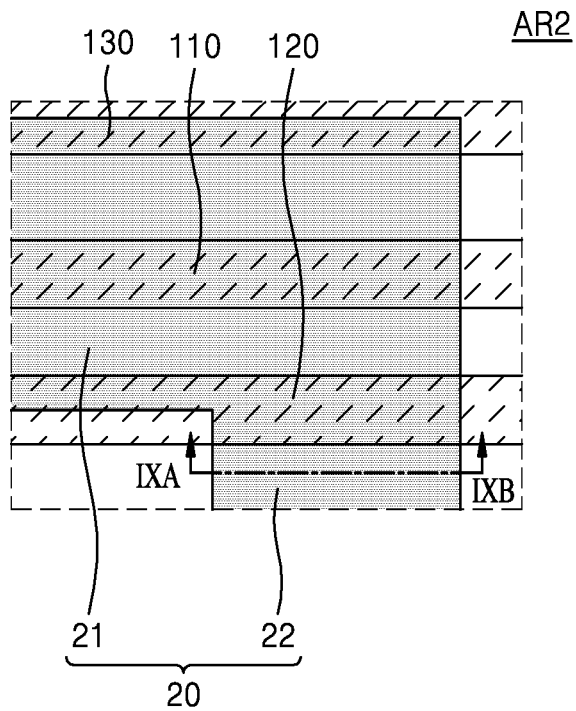
FIG. 8 is an enlarged plan view illustrating portion AR2 according to a comparative example.
Figure 9:
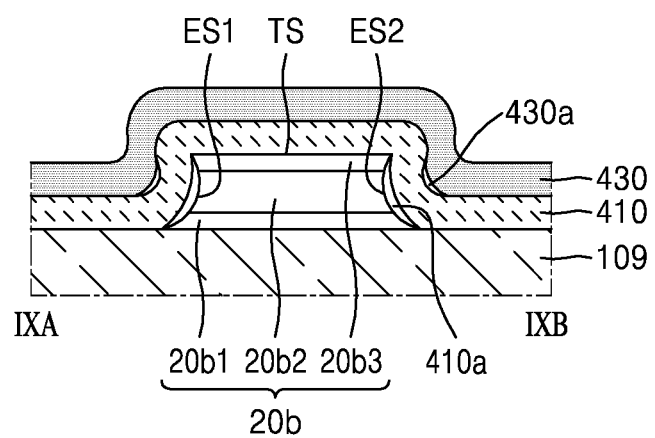
FIG. 9 is a schematic cross-sectional view taken along line IXA-IXB of FIG. 8.

FIG. 8 is an enlarged plan view illustrating a portion AR2 according to a comparative example, and FIG. 9 is a schematic cross-sectional view taken along line IXA-IXB of FIG. 8. For convenience of explanation, the thin-film encapsulation layer 400 is not shown in a plan view of FIG. 8.

Referring to FIGS. 8 and 9, the connection layer 111d may be formed of the same or similar material as that of the second planarization film 111. The connection layer 111d and the second planarization film 111 may include a same or similar material. The connection layer 111d may not be formed on the fourth conductive layer 20b, and the first inorganic encapsulation layer 410 may be formed on or may be formed directly on the fourth conductive layer 20b. The second inorganic encapsulation layer 430 may be formed on or may be directly formed on the first inorganic encapsulation layer 410.

When the fourth conductive layer 20b in which the first layer 20b1 including Ti, the second layer 20b2 including Al, and the third layer 20b3 including Ti may be stacked is formed, an undercut may be formed in the first and second end portions ES1 and ES2 that may both be end portions of the fourth conductive layer 20b exposed to an etchant due to an etch rate difference between the second layer 20b2 and the first and third layers 20b1 and 20b3 while a pattern of the second planarization film 111 may be formed by using wet etching. When the first inorganic encapsulation layer 410 is formed in a state where the undercut may be formed, a cavity 410a may be formed between the first and second end portions ES1 and ES2 of the fourth conductive layer 20b and the first inorganic encapsulation layer 410 and a cavity 430a may be formed between both end portions of the first inorganic encapsulation layer 410 and the second inorganic encapsulation layer 430. The undercut and the cavities 410a and 430a may degrade step coverage of the first inorganic encapsulation layer 410 and the second inorganic encapsulation layer 430 to cause cracks, and the cracks may act as a penetration path, thereby reducing the reliability of the display apparatus 1.

However, according to the embodiment, because the top surface TS and the first end portion ES1 and the second end portion ES2 of the fourth conductive layer 20b of FIG. 7A or the top surface TS and the second end portion ES2 of the fourth conductive layer 20b of FIG. 7B may be covered or may be entirely covered by the connection layer 111d with a part of the second planarization film 111 remaining to prevent an undercut, step coverage of the first inorganic encapsulation layer 410 and the second inorganic encapsulation layer 430 may be improved and penetration of moisture may be prevented. The connection layer 111d covering the top surface TS and the first end portion ES1 and/or the second end portion ES2 of the fourth conductive layer 20b may be a cladding layer.

Figure 10:
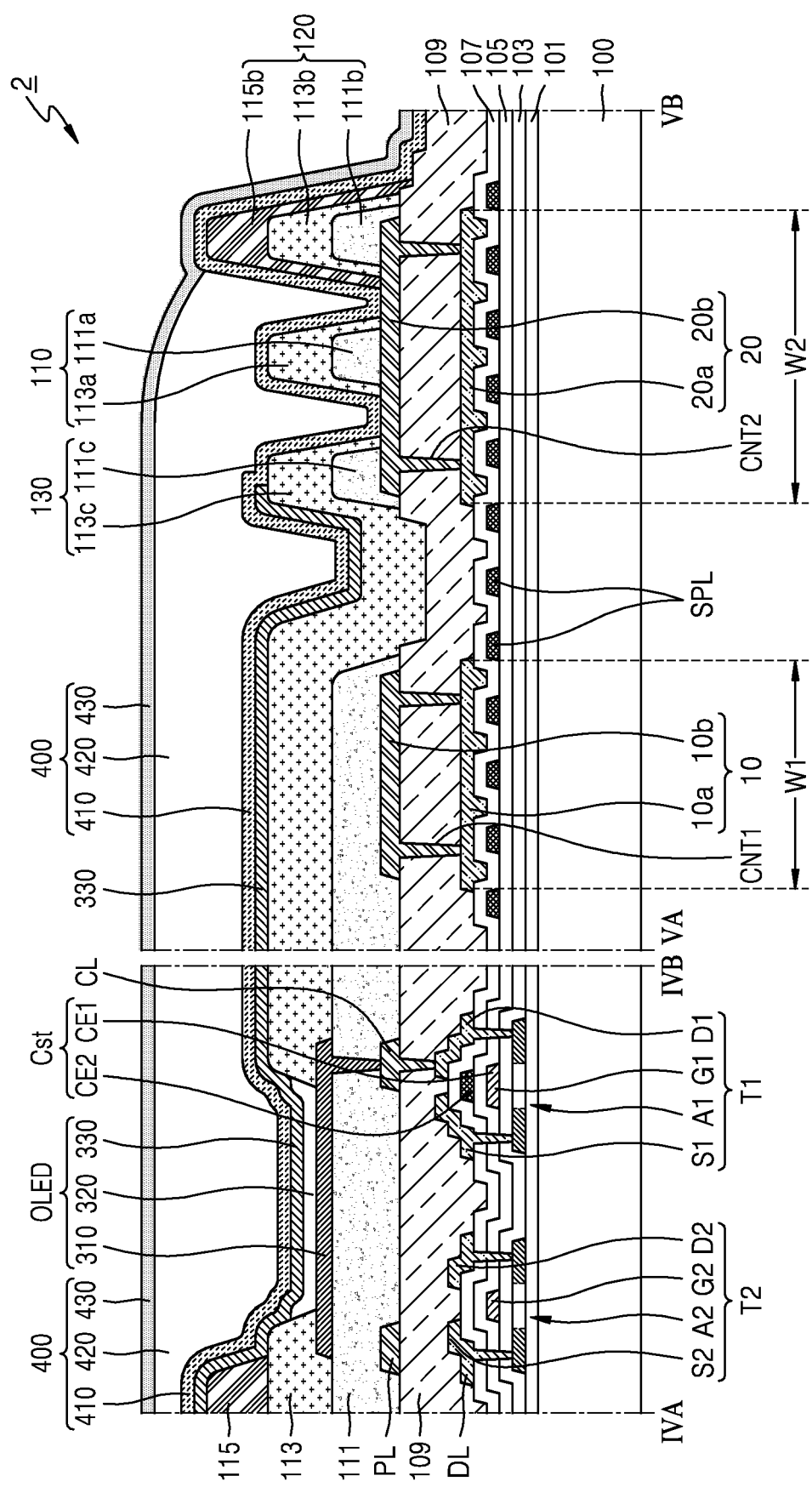
FIG. 10 is a schematic cross-sectional view of a display apparatus according to an embodiment.
Figure 11:
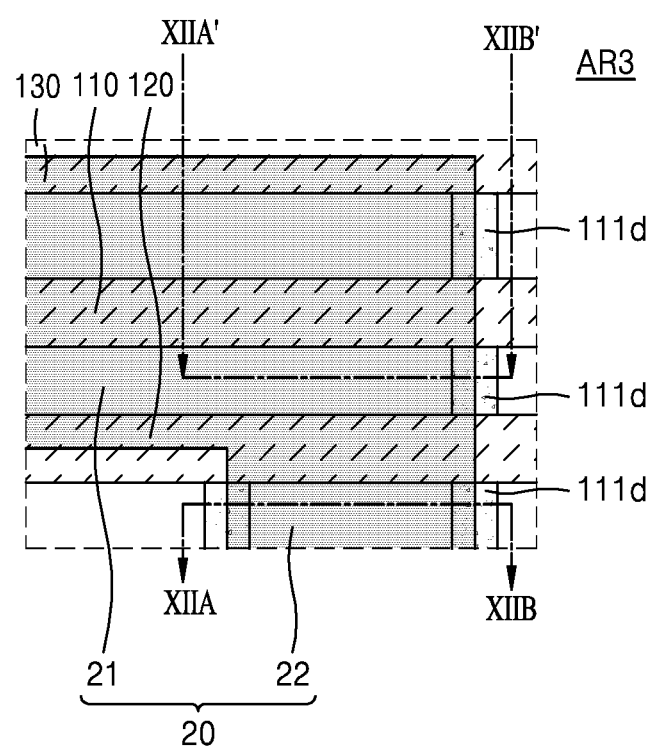
FIG. 11 is an enlarged plan view illustrating portion AR3.
Figure 12A:
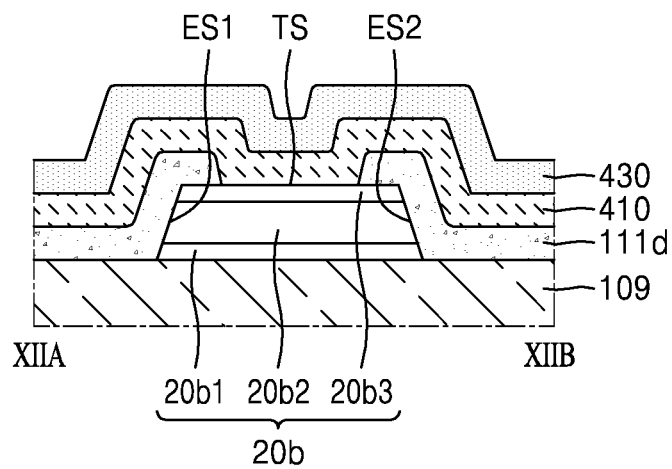
FIG. 12A is a schematic cross-sectional view taken along line XIIA-XIIB of FIG. 11.
Figure 12B:
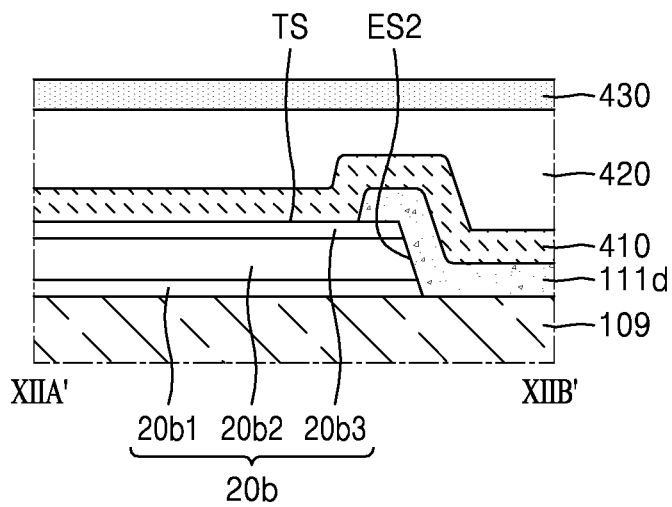
FIG. 12B is a schematic cross-sectional view taken along line XIIA'-XIIB' of FIG. 11.

An embodiment will be described with reference to FIGS. 10 through 12. FIG. 10 is a schematic cross-sectional view of a display apparatus 2 according to an embodiment, FIG. 11 is an enlarged plan view illustrating a portion AR3, FIG. 12A is a schematic cross-sectional view taken along line XIIA-XIIB of FIG. 11, and FIG. 12B is a schematic cross-sectional view taken along line XIIA'-XIIB' of FIG. 11. For convenience of explanation, the thin-film encapsulation layer 400 is not shown in a plan view of FIG. 11. The following description will focus on a difference from the above embodiments.

Referring to FIG. 10, a left view illustrates a structure of the pixel P and a right view is a schematic cross-sectional view taken along line VA-VB of FIG. 1.

In a portion VA-VB, the buffer layer 101, the first gate insulating layer 103, the second gate insulating layer 105, the interlayer insulating layer 107, and the first planarization film 109 extending in the display area DA may be located or disposed on the substrate 100. The spider wirings SPL may be located or disposed between the second gate insulating layer 105 and the interlayer insulating layer 107, the first conductive layer 10a and the third conductive layer 20a may be located or disposed on the interlayer insulating layer 107, and the second conductive layer 10b and the fourth conductive layer 20b may be located or disposed on the first planarization film 109.

The first conductive layer 10a and the second conductive layer 10b may be connected to each other through the first contact holes CNT1 formed in the interlayer insulating layer 107 and may constitute the first power supply voltage line 10 that may supply the first power supply voltage ELVDD (see FIGS. 2A and 2B) to each pixel P. The third conductive layer 20a and the fourth conductive layer 20b may be connected to each other through the second contact holes CNT2 formed in the interlayer insulating layer 107 and may constitute the second power supply voltage line 20 that may supply the second power supply voltage ELVSS (see FIGS. 2A and 2B) to each pixel P.

The second planarization film 111 may be located or disposed on the second conductive layer 10b and the pixel-defining film 113 may be located or disposed on the second planarization film 111, to overlap the first power supply voltage line 10. The counter electrode 330 extending in the display area DA may be located or disposed on the pixel-defining film 113.

The third dam portion 130, the first dam portion 110, and the second dam portion 120 extending in the display area DA to an end portion of the substrate 100 may be sequentially located or disposed to overlap the second power supply voltage line 20. The third dam portion 130 may include the first layer 111c that may be formed of the same or similar material as that of the second planarization film 111 and the second layer 113c may be formed of the same or similar material as that of the pixel-defining film 113. The first layer 111c and the second planarization film 111 may include a same or similar material. The first dam portion 110 may include the first layer 111a that may be formed of the same or similar material as that of the second planarization film 111 and the second layer 113a may be formed of the same or similar material as that of the pixel-defining film 113. The second dam portion 120 may include the first layer 111b that may be formed of the same or similar material as that of the second planarization film 111, the second layer 113b may be formed of the same or similar material as that of the pixel-defining film 113, and the third layer 115b may be formed of the same or similar material as that of the spacer 115. The third layer 115b and the spacer 115 may include a same or similar material.

Unlike in FIG. 5, the first layer 111c of the third dam portion 130, the first layer 111a of the first dam portion 110, and the first layer 111b of the second dam portion 120 of the embodiment may be separated from one another. That is, the connection layer 111d may not be formed on a portion of the fourth conductive layer 20b where each of the first through third dam portions 110, 120, and 130 may not be located or disposed. However, referring to FIGS. 11, 12A, and 12B, the first end portion ES1 and the second end portion ES2 of the fourth conductive layer 20b may be clad by the connection layer 111d.

Referring to FIGS. 11 and 12A, the fourth conductive layer 20b of the second power supply voltage line 20 may be located disposed on the first planarization film 109, and outside the second dam portion 120, the first end portion ES1 and the second end portion ES2 of the fourth conductive layer 20b may be clad by the connection layer 111d that may be formed of the same or similar material as that of the second planarization film 111. An undercut may be prevented from being formed in the first end portion ES1 and the second end portion ES2 of the fourth conductive layer 20b, because the first end portion ES1 and the second end portion ES2 of the fourth conductive layer 20b in which an undercut may be formed while a pattern of the second planarization film 111 may be formed by using wet etching may be clad by the connection layer 111d. Step coverage of the first inorganic encapsulation layer 410 and the second inorganic encapsulation layer 430 may be improved. In this case, the top surface TS of the fourth conductive layer 20b in which an undercut may not be formed may not be clad by the connection layer 111d.

Referring to FIGS. 11 and 12B, the fourth conductive layer 20b of the second power supply voltage line 20 may be located or disposed on the first planarization film 109, and between the first dam portion 110 and the second dam portion 120, the second end portion ES2 of the fourth conductive layer 20b may be clad by the connection layer 111d that may be formed of the same or similar material as that of the second planarization film 111 An undercut may be prevented from being formed in the second end portion ES2 of the fourth conductive layer 20b, because the second end portion ES2 of the fourth conductive layer 20b in which an undercut may be formed while a pattern of the second planarization film 111 may be formed by using wet etching is clad by the connection layer 111d. Step coverage of the first inorganic encapsulation layer 410 and the second inorganic encapsulation layer 430 may thus be improved. The top surface TS of the fourth conductive layer 20b in which an undercut is may not be formed may not be clad by the connection layer 111d.

Figure 13:
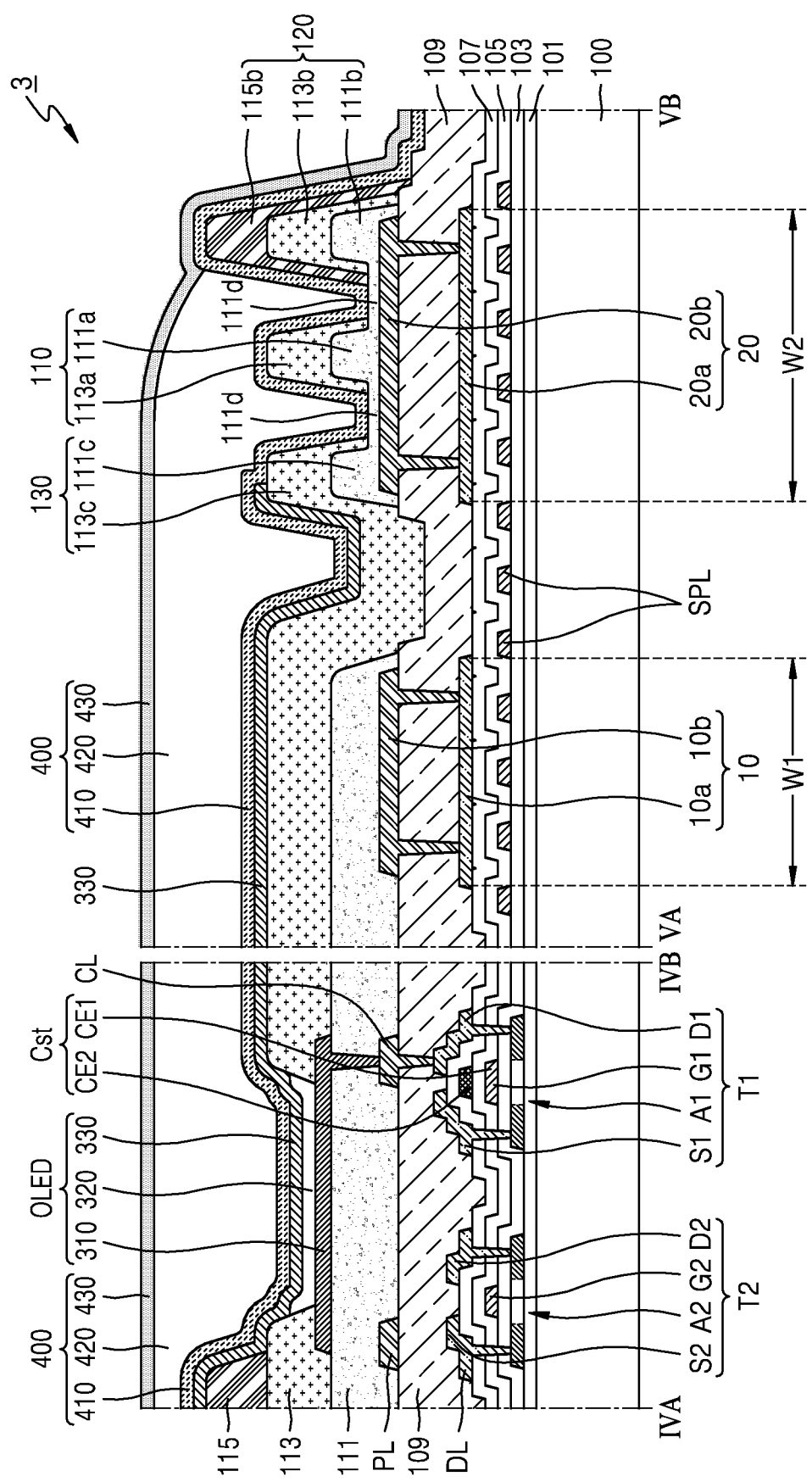
FIG. 13 is a schematic cross-sectional view of a display apparatus according to an embodiment.

An embodiment will now be described with reference to FIG. 13. FIG. 13 is a schematic cross-sectional view of a display apparatus 3 according to an embodiment. The following description will focus on a difference from the display apparatus 1.

Referring to FIG. 13, a left view illustrates a structure of the pixel P of FIG. 4, and a right view is a schematic cross-sectional view taken along line VA-VB of FIG. 1.

In a portion VA-VB, unlike in the display apparatus 1 where the spider wirings SPL may be located or disposed between the second gate insulating layer 105 and the interlayer insulating layer 107, the spider wirings SPL of an embodiment may be located or disposed between the first gate insulating layer 103 and the second gate insulating layer 105. The spider wirings SPL may extend from a driving circuit unit (not shown) to the terminal unit 30 (see FIG. 1) and may be spaced apart from one another.

According to an embodiment, because a degree of freedom in designing the spider wirings SPL may be increased, and unlike in the display apparatus 1, a thickness of an insulating layer between the spider wirings SPL and the first conductive layer 10a and the third conductive layer 20a may be increased and interference that may occur between the spider wirings SPL and the first conductive layer 10a and the third conductive layer 20a may be reduced.

Figure 14:
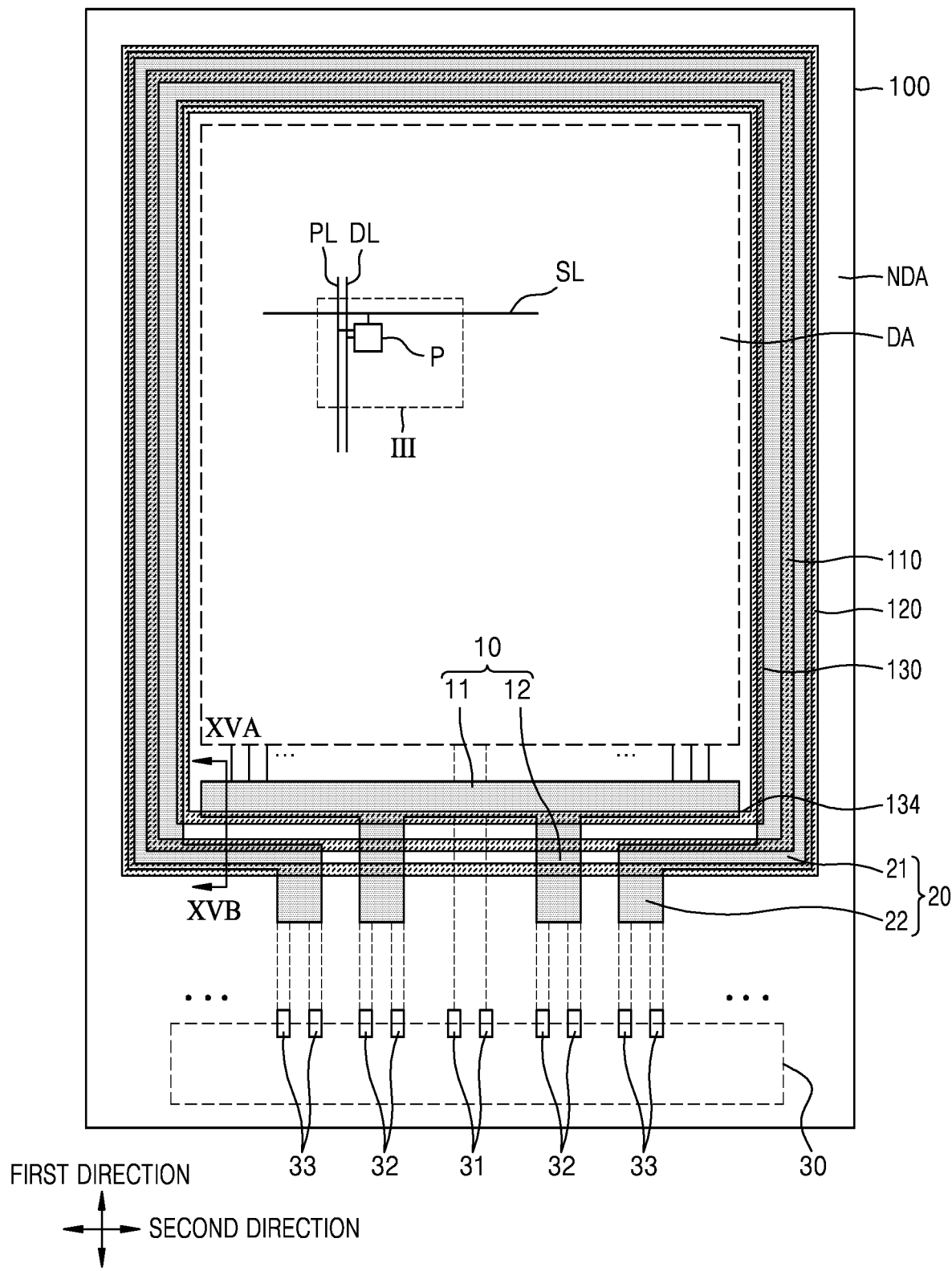
FIG. 14 is a plan view of a display apparatus according to an embodiment.
Figure 15:
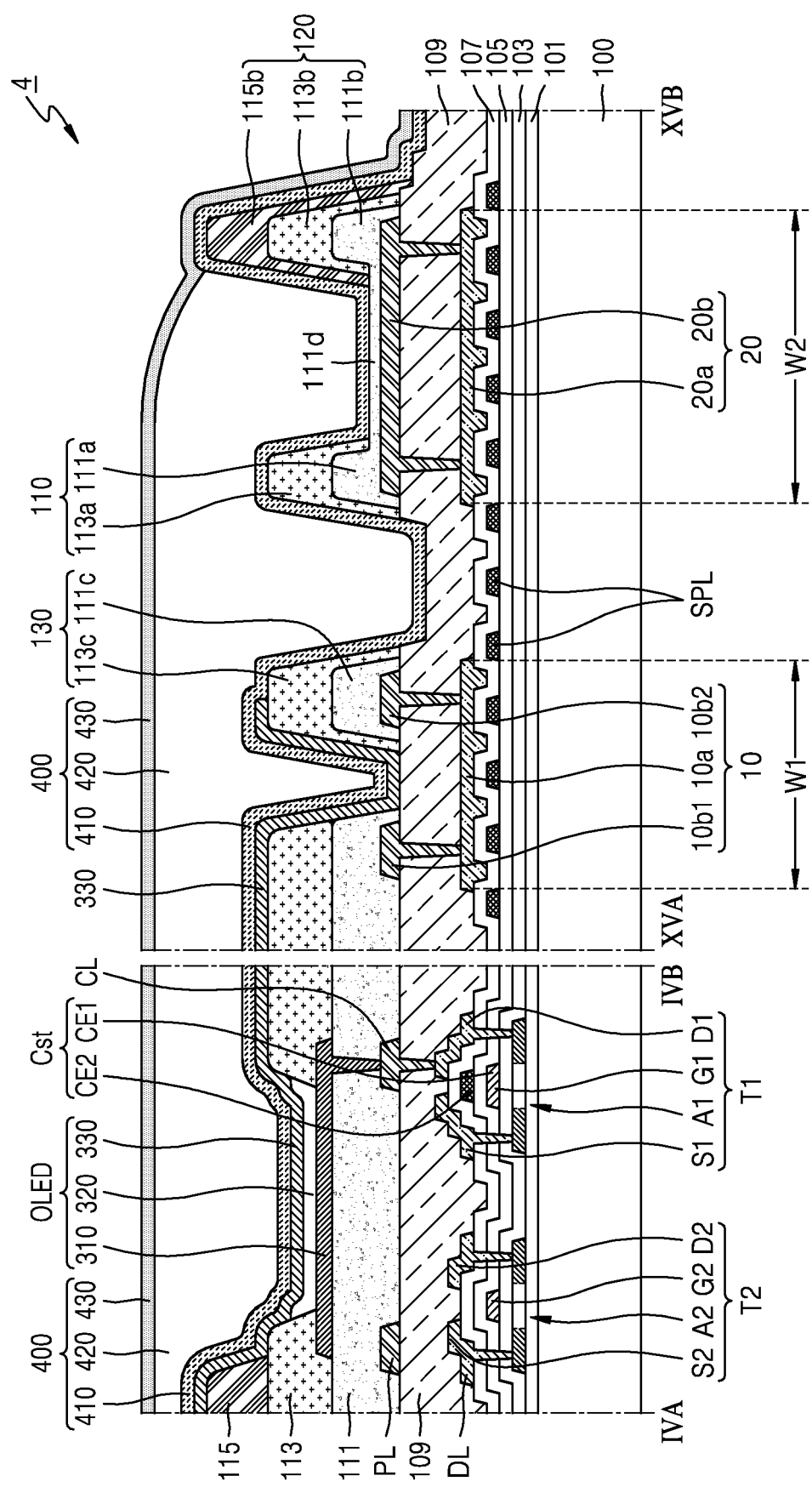
FIG. 15 is a schematic cross-sectional view of the display apparatus according to an embodiment, taken along line XVA-XVB of FIGS. 4 and 14.

An embodiment of the disclosure will be described with reference to FIGS. 14 and 15. FIG. 14 is a plan view of a display apparatus 4 according to an embodiment, and FIG. 15 is a schematic cross-sectional view of the display apparatus 4 according to an embodiment, taken along line XVA-XVB of FIG. 14. The following description will focus on a difference from the display apparatus 1.

Referring to FIGS. 14 and 15, in the non-display area NDA, the first dam portion 110, the second dam portion 120, and the third dam portion 130 surrounding or around the display area DA may be spaced apart from one another.

Unlike in the display apparatus 1 where the third dam portion 130, the first dam portion 110, and the second dam portion 120 may all overlap the second power supply voltage line 20, in the display apparatus 4 of an embodiment, the third dam portion 130 may overlap the first power supply voltage line 10 and the first dam portion 110 and the second dam portion 120 may overlap the second power supply voltage line 20.

Similar to the display apparatus 1, the first layer 111a of the first dam portion 110 and the first layer 111b of the second dam portion 120 of an embodiment may be connected to each other by the connection layer 111d without being separated from each other. For example, a top surface of the fourth conductive layer 20b may be covered or may be entirely covered by the connection layer 111d.

Although not shown in FIGS. 14 and 15, similar to FIGS. 7A and 7B, because the top surface TS and the first end portion ES1 and the second end portion ES2 of the fourth conductive layer 20b or the top surface TS and the second end portion ES2 of the fourth conductive layer 20b may be covered or may be entirely covered by the connection layer 111d with a part of the second planarization film 111 remaining, an undercut may be prevented from being formed in the first end portion ES1 and/or the second end portion ES2 of the fourth conductive layer 20b, thereby improving step coverage of the first inorganic encapsulation layer 410 and the second inorganic encapsulation layer 430 and preventing penetration of moisture.

A degree of freedom of design may be improved because the third dam portion 130 may overlap the first power supply voltage line 10 in the embodiment. An organic material may be prevented from flowing to an edge of the substrate 100 when the organic encapsulation layer 420 including the organic material such as a monomer may be formed because the third dam portion 130 may be located or disposed closer to the display area DA.

Figure 16:
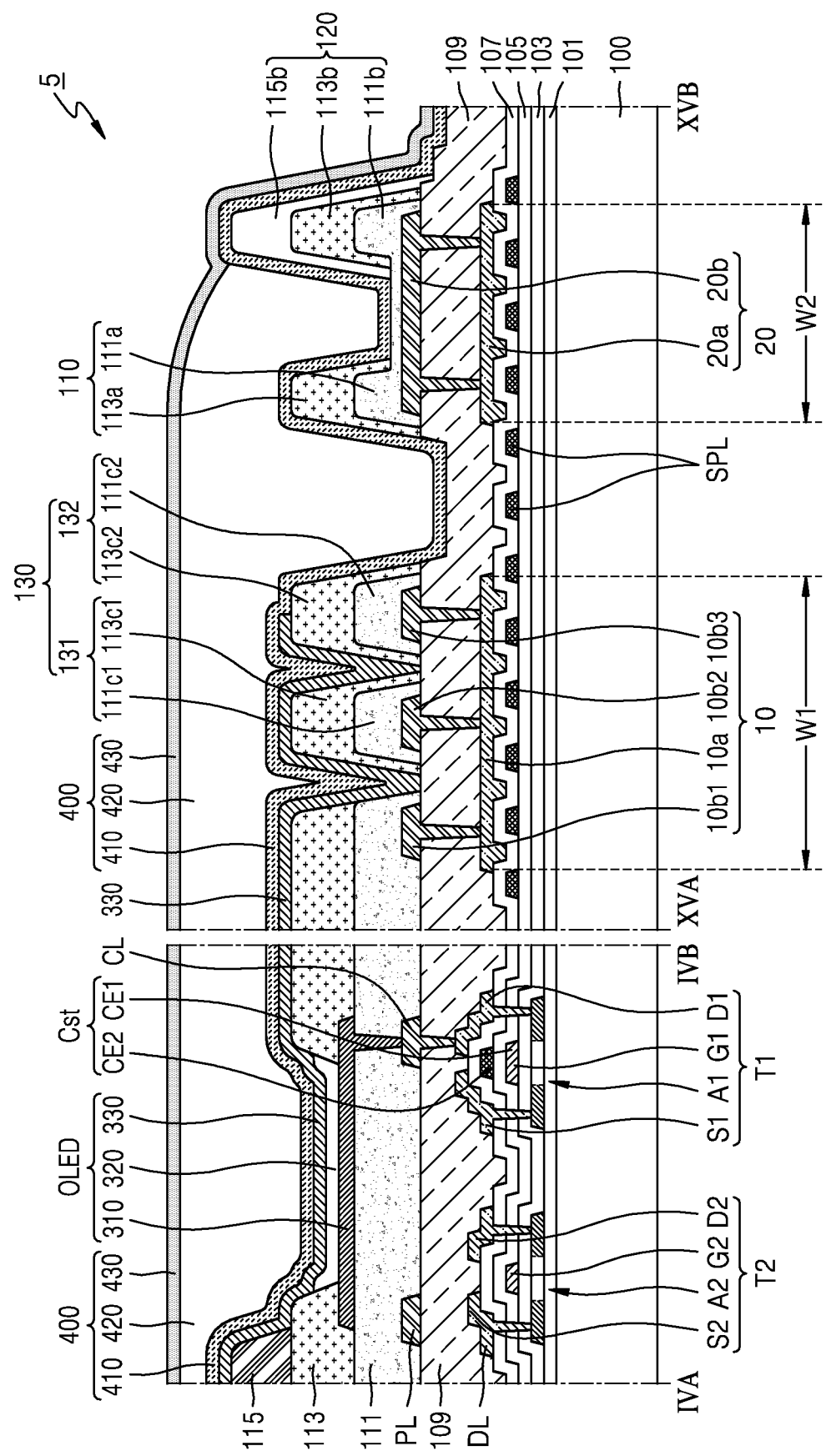
FIG. 16 is a schematic cross-sectional view of a display apparatus according to an embodiment.

An embodiment will be described with reference to FIG. 16. FIG. 16 is a schematic cross-sectional view of a display apparatus 5 according to an embodiment. The following description will focus on a difference from the display apparatus 4 of FIG. 15.

Similar to the display apparatus 4, even in the display apparatus 5 of an embodiment, the third dam portion 130 may overlap the first power supply voltage line 10 and the first dam portion 110 and the second dam portion 120 may overlap the second power supply voltage line 20. However, in an embodiment, the number of the third dam portions 130 that may overlap the first power supply voltage line 10 may be two. For example, the third dam portion 130 includes a first portion 131 of the third dam portion 130 that may be located or disposed closer to the display area DA and a second portion 132 of the third dam portion 130 may be closer to the first dam portion 110. However, the disclosure is not limited thereto, and the number of the third dam portions 130 may be increased. When the number of the third dam portions 130 is increased, an organic material may be more effectively prevented from flowing to an edge of the substrate 100.

In an embodiment, because the width W1 of the first power supply voltage line 10 may be greater than the width W2 of the second power supply voltage line 20, voltage drop may be reduced and the third dam portions 130 may be stably located or disposed to overlap the first power supply voltage line 10.

According to the one or more embodiments, because a second power supply voltage line may include two conductive layers and an end portion of an upper conductive layer may be clad by an insulating film, an undercut may be prevented from being formed in the upper conductive layer. Cavities that may be formed due to the undercut and cracks due to degradation of step coverage may be prevented. There may be provided display apparatuses for providing high-quality images due to a power supply voltage line with reduce voltage drop.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:
1. A display apparatus comprising:
a substrate;
a display area disposed on the substrate and comprising a plurality of pixels;
a non-display area disposed outside the display area;
a first power supply voltage line comprising:
 a first conductive layer disposed in the non-display area; and
 a second conductive layer disposed on the first conductive layer;
a second power supply voltage line disposed in the non-display area and comprising:
 a third conductive layer spaced apart from the first conductive layer; and
 a fourth conductive layer disposed on the third conductive layer;
a first dam portion surrounding the display area and overlapping the second power supply voltage line;

a second dam portion disposed adjacent to the first dam portion; and
a cladding layer covering a first end portion of the fourth conductive layer formed in a direction intersecting a direction in which the first and second dam portions extend,
wherein the third conductive layer is connected to the fourth conductive layer through contact holes.

2. The display apparatus of claim 1, further comprising:
a first planarization film disposed in the display area and the non-display area;
a second planarization film disposed on the first planarization film; and
a pixel-defining film disposed on the second planarization film, wherein
the first dam portion comprises:
    a first layer comprising a part of the second planarization film; and
    a second layer comprising a part of the pixel-defining film, and
the second dam portion comprises:
    a first layer comprising a part of the second planarization film; and
    a second layer comprising a part of the pixel-defining film.

3. The display apparatus of claim 2, wherein
the cladding layer and the second planarization film includes a same material.

4. The display apparatus of claim 2, wherein
the first planarization film is disposed between the first conductive layer and the second conductive layer, and
the first power supply voltage line is electrically connected to the first conductive layer and the second conductive layer through a first contact hole formed in the first planarization layer.

5. The display apparatus of claim 2, wherein
the first planarization film is disposed between the third conductive layer and the fourth conductive layer, and
the first power supply voltage line is electrically connected to the third conductive layer and the fourth conductive layer through a second contact hole formed in the first planarization layer.

6. The display apparatus of claim 2, further comprising
a third dam portion disposed between the display area and the first dam portion, the third dam portion comprising:
    a first layer comprising a part of the second planarization film; and
    a second layer comprising a part of the pixel-defining film.

7. The display apparatus of claim 6, wherein each of the plurality of pixels comprises:
a first electrode;
an emission layer disposed on the first electrode; and
a second electrode disposed on the emission layer, wherein
the second electrode is commonly disposed over the plurality of pixels, and
the second electrode extends to the non-display area and covers a part of the third dam portion.

8. The display apparatus of claim 7, further comprising a spacer disposed on the pixel-defining film, wherein
the pixel-defining film is disposed on the second planarization film and covers an end portion of the first electrode,
the second dam portion further comprises a third layer formed on the second layer comprising the part of the pixel-defining film, and
the third layer of the second dam portion and the spacer include a same material.

9. The display apparatus of claim 8, wherein
a height of the second dam portion is greater than a height of each of the first dam portion and the third dam portion.

10. The display apparatus of claim 6, wherein
the first dam portion, the second dam portion, and the third dam portion overlap the second power supply voltage line.

11. The display apparatus of claim 6, wherein
the third dam portion overlaps the first power supply voltage line, and
the first dam portion and the second dam portion overlap the second power supply voltage line.

12. The display apparatus of claim 11, wherein the third dam portion comprises:
a first portion disposed adjacent to the display area; and
a second portion disposed adjacent to the first dam portion.

13. The display apparatus of claim 12, wherein
a width of the first power supply voltage line is greater than a width of the second power supply voltage line.

14. The display apparatus of claim 2, wherein
the second planarization film covers a third end portion of the fourth conductive layer formed in a direction parallel to the direction in which the first and second dam portions extend.

15. The display apparatus of claim 1, wherein
the first conductive layer and the third conductive layer includes a same material, and
the second conductive layer and the fourth conductive layer includes a same material.

16. The display apparatus of claim 1, wherein,
the cladding layer covers a top surface and the first end portion of the fourth conductive layer between the first dam portion and the second dam portion.

17. The display apparatus of claim 1, wherein,
the cladding layer covers the first end portion of the fourth conductive layer between the first dam portion and the second dam portion, and
the cladding layer does not cover at least a part of a top surface of the fourth conductive layer between the first dam portion and the second dam portion.

18. The display apparatus of claim 1, wherein,
the fourth conductive layer further comprises a second end portion facing the first end portion outside the second dam portion,
the cladding layer covers the first dam portion and the second dam portion outside the second dam portion, and
the cladding layer does not cover at least a part of a top surface of the fourth conductive layer outside the second dam portion.

19. The display apparatus of claim 1, further comprising a thin-film encapsulation layer comprising:
a first inorganic encapsulation layer covering the display area;
an organic encapsulation layer disposed on the first inorganic encapsulation layer; and
a second inorganic encapsulation layer disposed on the organic encapsulation layer,
wherein the thin-film encapsulation layer covers the third dam portion and the first dam portion.

20. The display apparatus of claim 19, wherein
the first inorganic encapsulation layer and the second inorganic encapsulation layer contact each other outside the second dam portion.

21. A display apparatus comprising:
a substrate;
a display area disposed in the substrate and comprising a plurality of pixels;
a non-display area disposed outside the display area;
a first power supply voltage line comprising:
　a first conductive layer disposed in the non-display; and
　a second conductive layer disposed on the first conductive layer;
a second power supply voltage line disposed in the non-display area and comprising:
　a third conductive layer spaced apart from the first conductive layer; and
　a fourth conductive layer disposed on the third conductive layer;
a first dam portion surrounding the display area and overlapping the second power supply voltage line;
a second dam portion disposed adjacent to the first dam portion; and
a cladding layer covering a first end portion of the fourth conductive layer formed in a direction intersecting a direction in which the first and second dam portions extend,
the fourth conductive layer further comprises a second end portion facing the first end portion outside the second dam portion, and,
the cladding layer covers a top surface and the first and second end portions of the fourth conductive layer outside the second dam portion.

22. A display apparatus comprising:
a substrate;
a display area disposed on the substrate and comprising a plurality of pixels;
a non-display area disposed outside die display area;
a first power supply voltage line comprising:
　a first conductive layer disposed in the non-display area; and
　a second conductive layer disposed on the first conductive layer;
a second power supply voltage line disposed in the non-display area and comprising:
　a third conductive layer spaced apart from the first conducive layer; and
　a fourth conductive layer disposed on the third conductive layer;
a first dam portion surrounding the display area and overlapping the second power supply voltage line;
a second dam portion disposed adjacent to the first dam portion;
a cladding layer covering a first end portion of the fourth conductive layer formed in a direction intersecting a direction in which the first and second dam portions extend; and
a plurality of spider wirings spaced apart from one another in a direction intersecting a direction in which the first and third conductive layers extend between the substrate and the first and third conductive layers.

23. The display apparatus of claim 22, further comprising at least two insulating layers extend to the display area between the plurality of spider wirings and the first and third conductive layers.

24. A display apparatus comprising:
a display area comprising a plurality of pixels;
a non-display area disposed outside the display area;
a first power supply voltage line disposed outside the non-display area;
a second power supply voltage line spaced apart from the first power supply voltage line;
a first dam portion surrounding the display area and overlapping the second power supply voltage line;
a second dam portion disposed adjacent to the first dam portion;
a third dam portion disposed between the display area and the first dam portion; and
an insulating layer forming a part of the first dam portion and the second dam portion,
wherein the insulating layer covers a first end portion of the second power supply voltage line formed in a direction intersecting a direction in which the first through third dam portions extend and a third end portion of the second power supply voltage line formed in a direction parallel to the direction in which the first through third dam portions extend, and
at least one of the first power supply voltage line and the second power supply voltage line include conductive layers connected through contact holes.

25. The display apparatus of claim 24, wherein
the insulating layer further covers a top surface of the second power supply voltage line between the first end portion and the third end portion.

* * * * *